(12) United States Patent
Huang et al.

(10) Patent No.: US 12,094,768 B2
(45) Date of Patent: Sep. 17, 2024

(54) METHOD FOR SEALING A SEAM, SEMICONDUCTOR STRUCTURE, AND METHOD FOR MANUFACTURING THE SAME

(71) Applicant: TAIWAN SEMICONDUCTOR MANUFACTURING COMPANY, LTD., Hsinchu (TW)

(72) Inventors: Yu-Lien Huang, Hsinchu (TW);
Ching-Feng Fu, Hsinchu (TW);
Huan-Just Lin, Hsinchu (TW);
Che-Ming Hsu, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 202 days.

(21) Appl. No.: 17/370,198

(22) Filed: Jul. 8, 2021

(65) Prior Publication Data
US 2023/0008165 A1 Jan. 12, 2023

(51) Int. Cl.
| H01L 21/768 | (2006.01) |
| H01L 21/02 | (2006.01) |
| H01L 23/522 | (2006.01) |
| H01L 23/532 | (2006.01) |
| H01L 29/66 | (2006.01) |
| H01L 29/78 | (2006.01) |

(52) U.S. Cl.
CPC .. *H01L 21/76837* (2013.01); *H01L 21/76897* (2013.01); *H01L 23/5226* (2013.01); *H01L 21/02112* (2013.01); *H01L 21/0212* (2013.01); *H01L 21/02164* (2013.01); *H01L 21/02205* (2013.01); *H01L 21/02208* (2013.01); *H01L 21/02274* (2013.01); *H01L 23/5329* (2013.01); *H01L 29/66795* (2013.01); *H01L 29/785* (2013.01)

(58) Field of Classification Search
None
See application file for complete search history.

(56) References Cited

U.S. PATENT DOCUMENTS

| 6,211,065 B1* | 4/2001 | Xi | C23C 16/0281 |
| | | | 427/535 |
| 10,002,933 B1* | 6/2018 | Tang | H01L 29/42376 |
| 2017/0170011 A1* | 6/2017 | Zheng | H10B 41/42 |

* cited by examiner

*Primary Examiner* — Evren Seven
*Assistant Examiner* — Cole Leon Lindsey
(74) *Attorney, Agent, or Firm* — Birch, Stewart, Kolasch & Birch, LLP

(57) ABSTRACT

A method is provided for sealing a seam in a self-aligned contact (SAC) layer that is disposed on a gate of a semiconductor structure. The method includes depositing a filler in the seam to seal the seam.

20 Claims, 46 Drawing Sheets

METHOD FOR SEALING A SEAM, SEMICONDUCTOR STRUCTURE, AND METHOD FOR MANUFACTURING THE SAME

BACKGROUND

When filling a recess with a material to form an isolation layer (such as a self-aligned contact (SAC) layer) in the recess, a seam may be created in the isolation layer, especially for recesses that are deep and narrow. A post etching process implemented using chemical etching or plasma etching may widen the seam or make the seam deeper, so metal or slurry may fill in the seam in subsequent processes of forming metal contacts and chemical mechanical polishing, causing defects in products.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
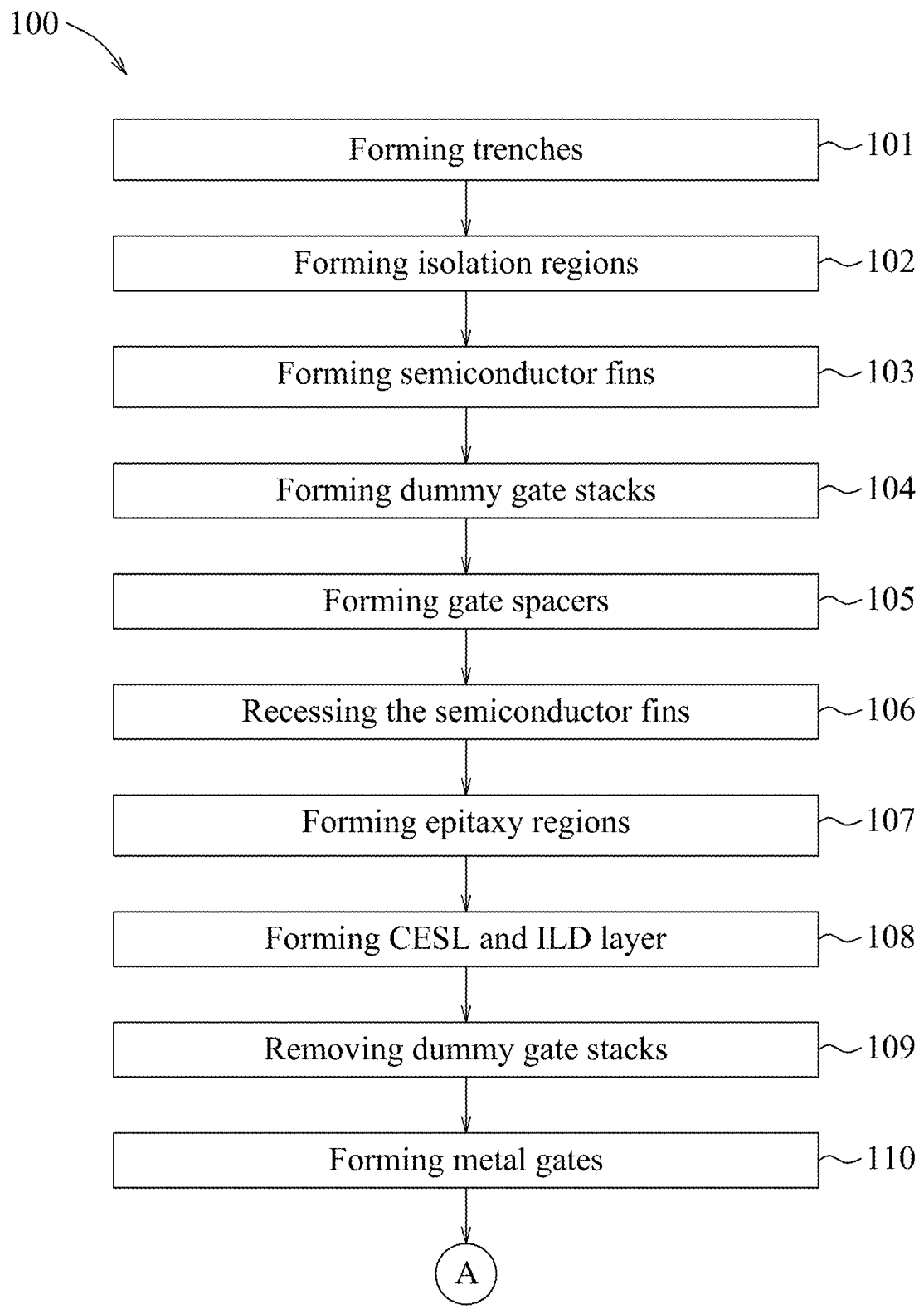
FIGS. 1A and 1B are flow diagrams illustrating a method for manufacturing a semiconductor structure with seams sealed in according with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "over," "nearby," "adjacent," "underneath," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The disclosure relates to sealing a seam or a void in a protective layer or a dielectric layer, such as a self-aligned contact (SAC) layer. The disclosure may be applied in all semiconductor industries.

Figure 1B:
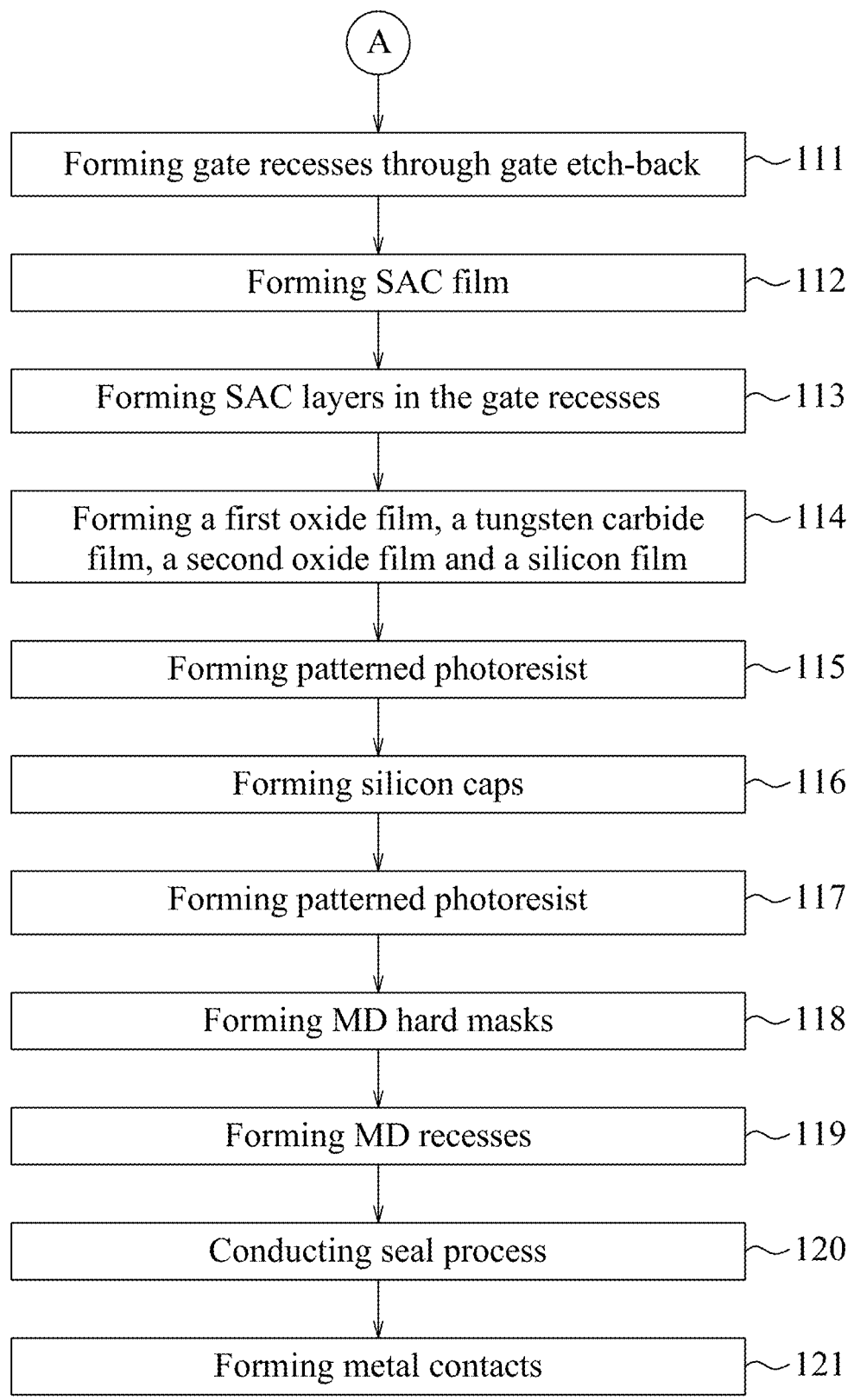

FIGS. 1A and 1B are flow diagrams illustrating a method 100 for manufacturing a semiconductor structure used for forming fin-type field effect transistor (FinFET) devices. In some embodiments, the semiconductor structure may be used for forming other technologically advanced semiconductor devices including, for example, but not limited to, nano-sheet transistor devices, nano-wire transistor devices, planar transistor devices, and other suitable devices.

FIGS. 2 to 45 illustrate schematic perspective, partial cross-sectional and top views of the intermediate stages of the method 100.

Figure 2:
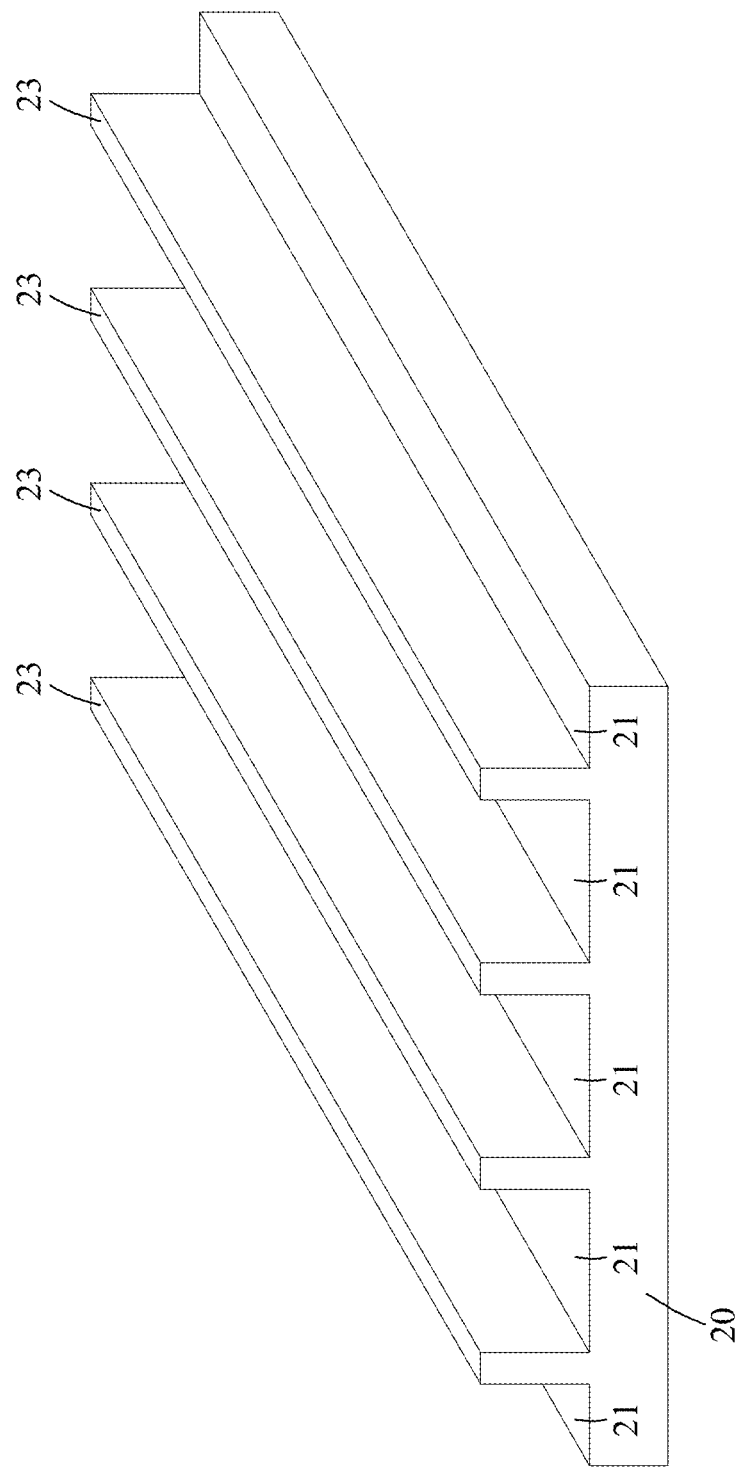
FIGS. 2 to 45 are schematic perspective, partial cross-sectional and top views illustrating intermediate stages of the method for manufacturing the semiconductor structure in accordance with some embodiments as depicted in FIGS. 1A and 1B.

Referring to FIGS. 1A and 2, the method 100 begins at step 101, where a plurality of trenches 21 are formed in a semiconductor substrate 20. The semiconductor substrate 20 may be, for example, but not limited to, a silicon substrate, a silicon carbon substrate, a silicon germanium substrate, or a substrate made of other semiconductor material, or a part of a wafer. The semiconductor substrate 20 may be non-doped or lightly-doped with an n-type impurity or a p-type. The trenches 21 may be formed by etching the semiconductor substrate 20.

Figure 3:
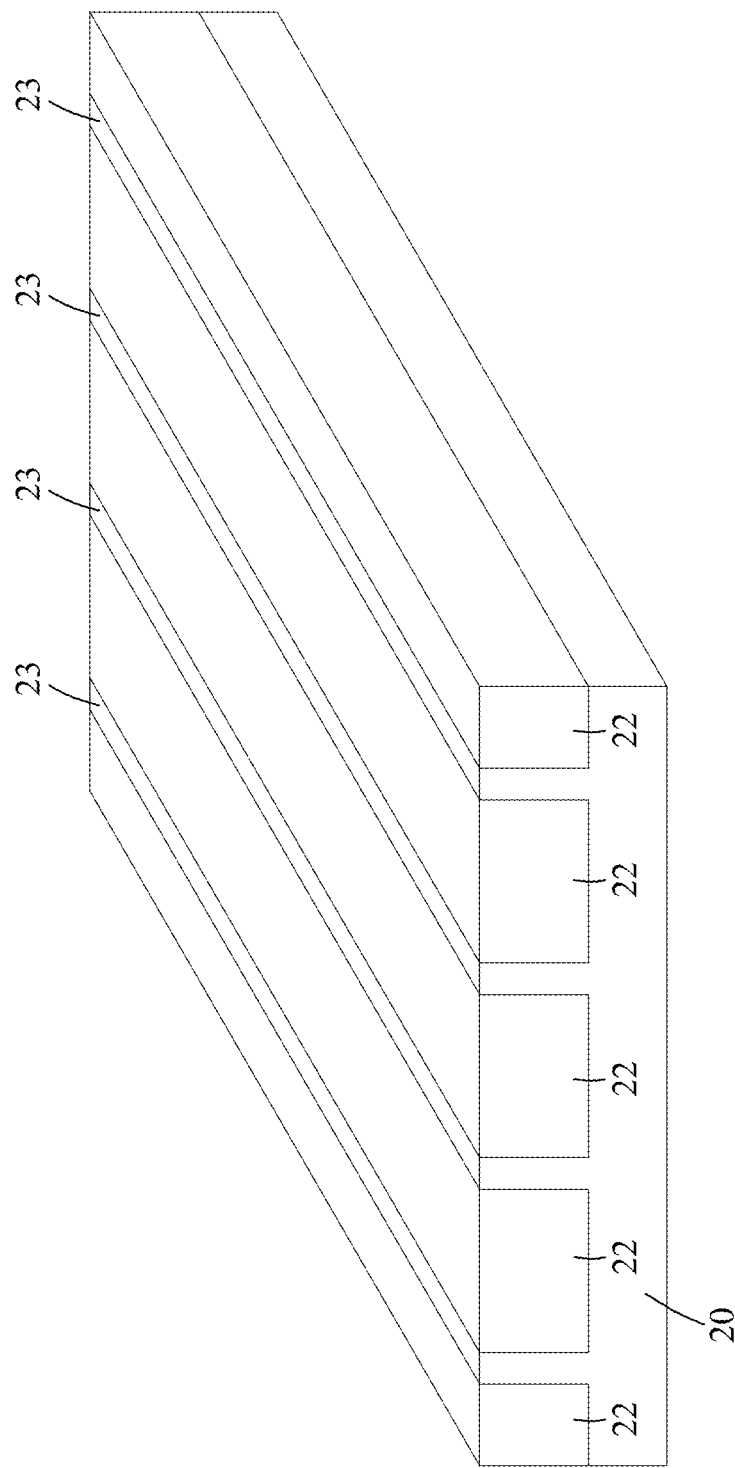

Referring to FIGS. 1A and 3, the method 100 proceeds to step 102, where isolation regions 22 are formed in the semiconductor substrate 20. The isolation regions 22 may be shallow trench isolation (STI) regions. Portions of the semiconductor substrate 20 between neighboring isolation regions 22 are referred to as semiconductor strips 23. The isolation regions 22 may be formed by filling the trenches 21 formed in step 101 with a dielectric material. The dielectric material for forming the isolation regions 22 may include, for example, but not limited to, silicon oxide, silicon nitride, silicon oxynitride, low dielectric constant (k) materials, other suitable materials, or combinations thereof. In some embodiments, a planarization process may be conducted so that top surfaces of the semiconductor strip 23 may be substantially level with top surfaces of the isolation regions 22. The planarization process may be implemented using a chemical mechanical polishing (CMP) process or other suitable techniques.

Figure 4:
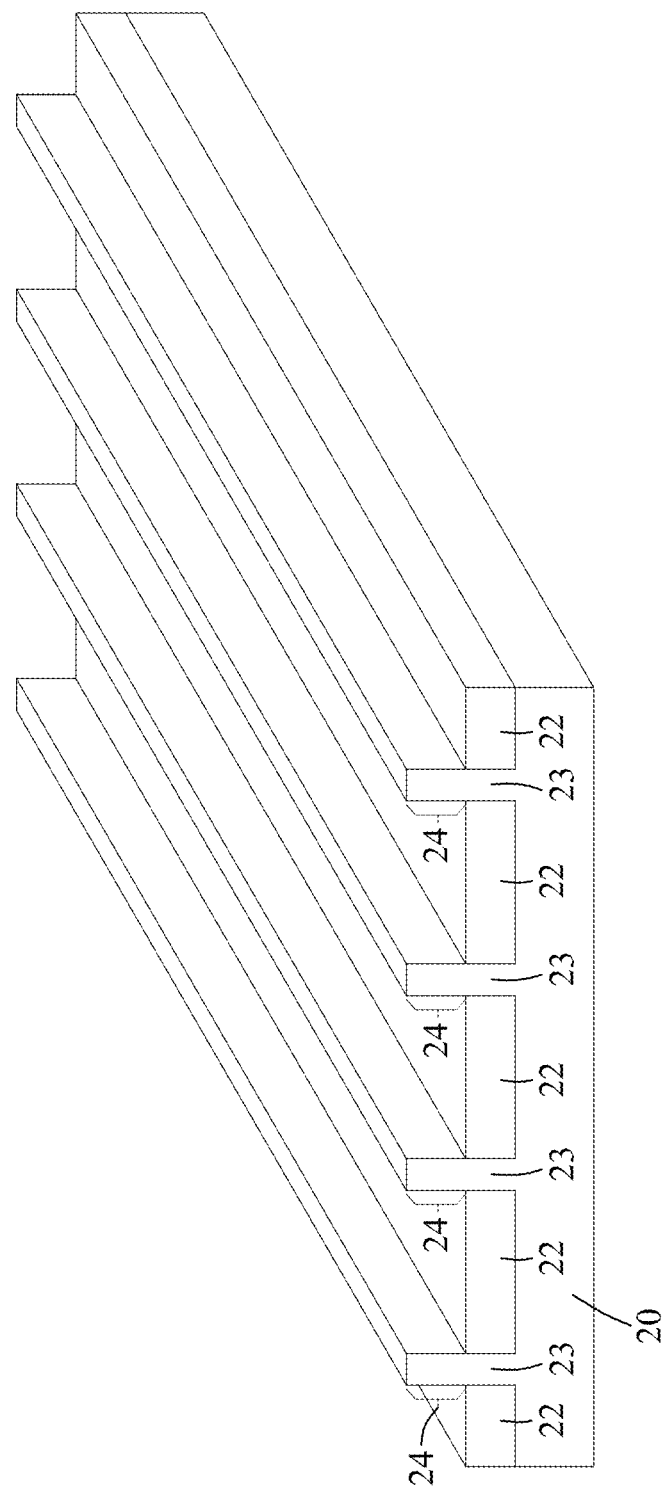

Referring to FIGS. 1A and 4, the method 100 proceeds to step 103, where the isolation regions 22 are recessed, so that top portions of the semiconductor strips 23 protrude over the top surfaces of the isolation regions 22 to form semiconductor fins 24. The recessing of the isolation regions 22 may be implemented by, for example, etching or other suitable methods. The etching may be performed using a dry etching process, wherein $HF_3$ and $NH_3$ are used as the etching gases, or may be performed using a wet etching process, where the etching chemical may include, for example, diluted HF.

Figure 5:
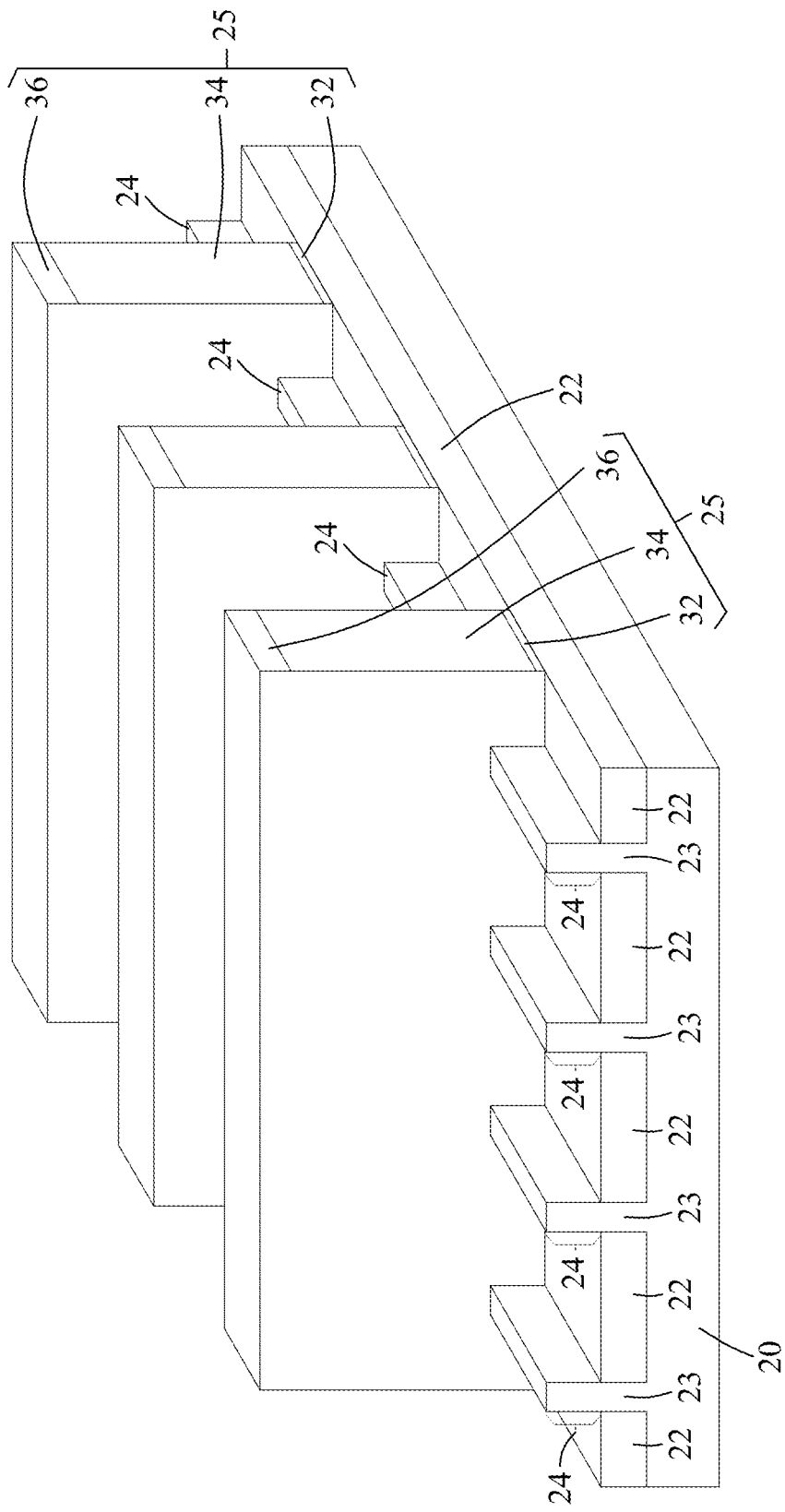

Referring to FIGS. 1A and 5, the method 100 proceeds to step 104, where dummy gate stacks 25 are formed over the semiconductor fins 24 and the isolation regions 22. Specifically, the dummy gate stacks 25 are formed on top surfaces and sidewalls of the semiconductor fins 24 and on the top surfaces of the isolation regions 22. Each of the dummy gate stacks 25 may include a dummy gate dielectric layer 32, a dummy gate electrode 34 over the dummy gate dielectric layer 32, and at least one dummy gate hard mask 36 (one dummy gate hard mask is exemplarily shown in FIG. 5) over the dummy gate electrode 34. Each of the dummy gate stacks 25 may cross over a single one or a plurality of the semiconductor fins 24 and/or the isolation regions 22 (four semiconductor fins 24 and five isolation regions 22 are exemplarily shown in FIG. 5, but the actual numbers of the semiconductor fins 24 and the isolation regions 22 are not limited to the disclosure herein). Each of the dummy gate stacks 25 may have a longitudinal axis substantially perpendicular to a longitudinal axis of the semiconductor fins 24.

Each of the dummy gate stacks 25 may be formed by depositing a layer of gate dielectric material (not shown), a layer of gate electrode material, and a layer of hard mask material (not shown), followed by a photolithography process and an etching process to form the dummy gate dielectric layer 32, the dummy gate electrode 34 and the dummy gate hard mask 36. The gate dielectric material may include, for example, but not limited to, silicon oxide, silicon nitride, silicon oxynitride, high dielectric constant (k) materials, other suitable materials, or combinations thereof. The gate electrode material may include, for example, but not limited to, polycrystalline silicon, single crystalline silicon, amorphous silicon, other suitable materials, or combinations thereof. The hard mask material may include, for example, but not limited to, silicon nitride, silicon oxide, silicon oxynitride, silicon carbonbitride, other suitable materials, or combinations thereof.

Figure 6:
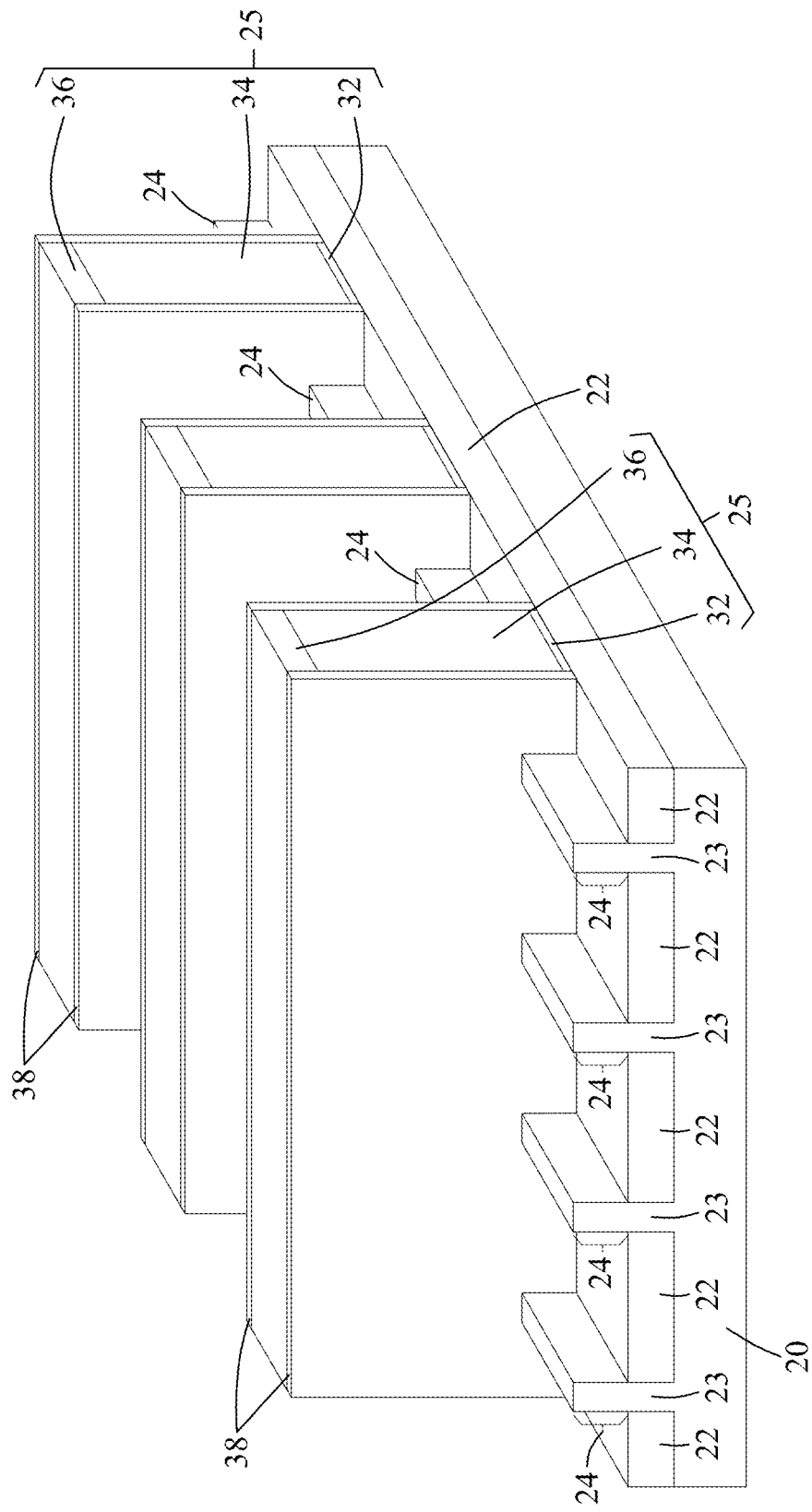

Referring to FIGS. 1A and 6, the method 100 proceeds to step 105, where gate spacers 38 are formed on sidewalls of the dummy gate stacks 25. In some embodiments, the gate spacers 38 are formed of a dielectric material such as, but not limited to, a silicon-carbon-containing material (e.g., silicon carbide or silicon carbon nitride), nitride, silicon nitride, or the like, and may have a single-layer structure or a multi-layer structure that includes a plurality of dielectric layers. The gate spacers 38 may be formed by forming at least one spacer layer over the dummy gate stacks 25, portions of the semiconductor fins 24 not covered by the dummy gate stacks 25, and the isolation regions 22 through, for example, a blanket deposition process, and then anisotropically etching the at least one spacer layer to make the gate spacers 38 formed on the sidewalls of the dummy gate stacks 38.

Figure 7:
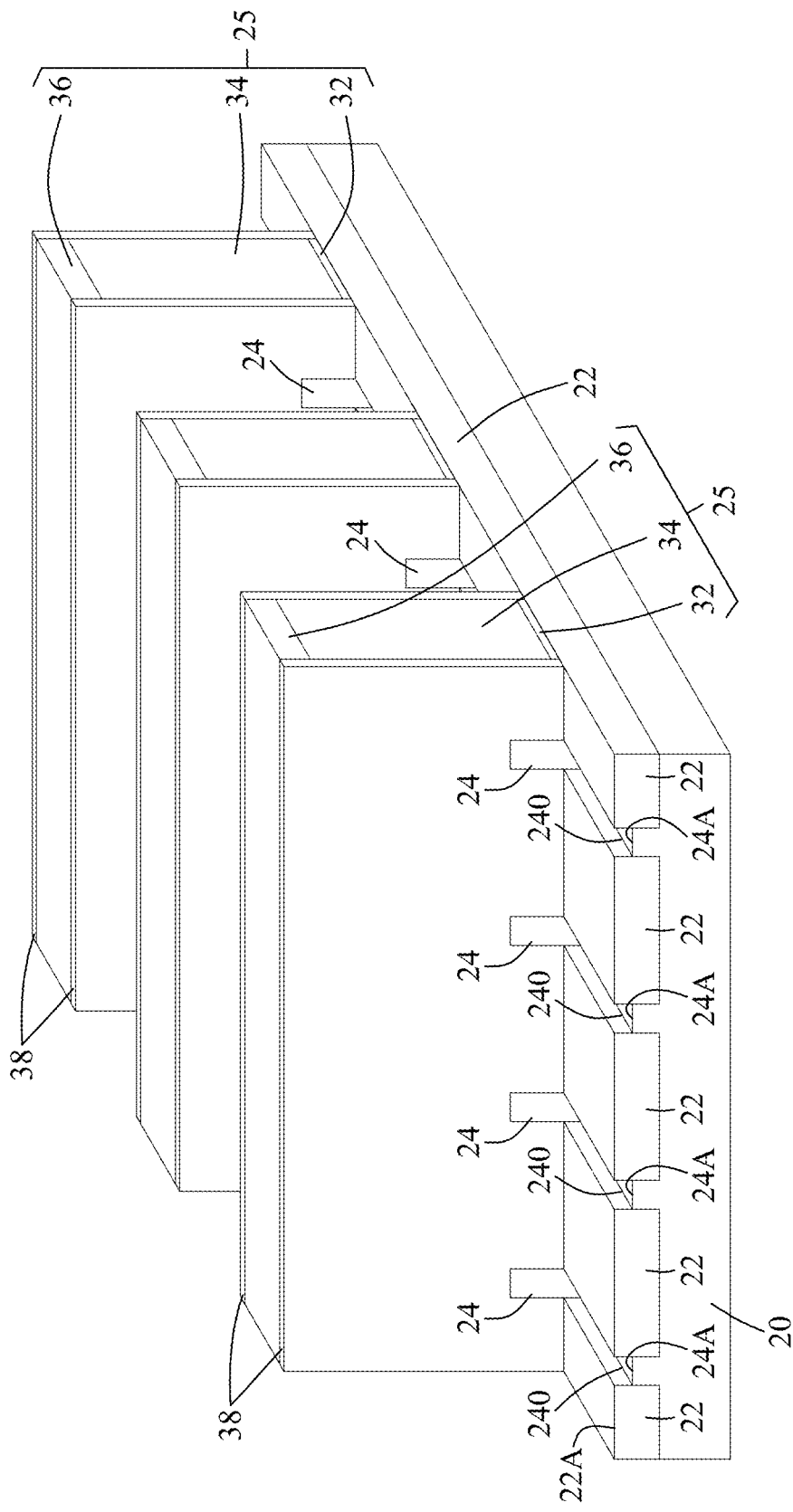

Referring to FIGS. 1A and 7, the method 100 proceeds to step 106, where recesses 240 are formed at positions of the semiconductor fins 24 not covered by the dummy gate stacks 25 and the gate spacers 38. Step 106 may be implemented by etching the semiconductor fins 24 not covered by the dummy gate stacks 25 and the gate spacers 38 through a known etching process in the art, such as, but not limited to, a dry etching process, a wet etching process, other suitable processes, or combinations thereof. The etching process may be anisotropic, and hence portions of the semiconductor fins 24 directly underneath the dummy gate stacks 25 and the gate spacers 38 are protected, and are not etched. Top surfaces 24A of portions of the semiconductor fins 24 that are etched to form the recesses 240 are lower than the top surfaces 22A of the isolation regions 22 in some embodiments, but may be equal to or higher than the top surfaces 22A of the isolation regions 22 in other embodiments.

Figure 8:
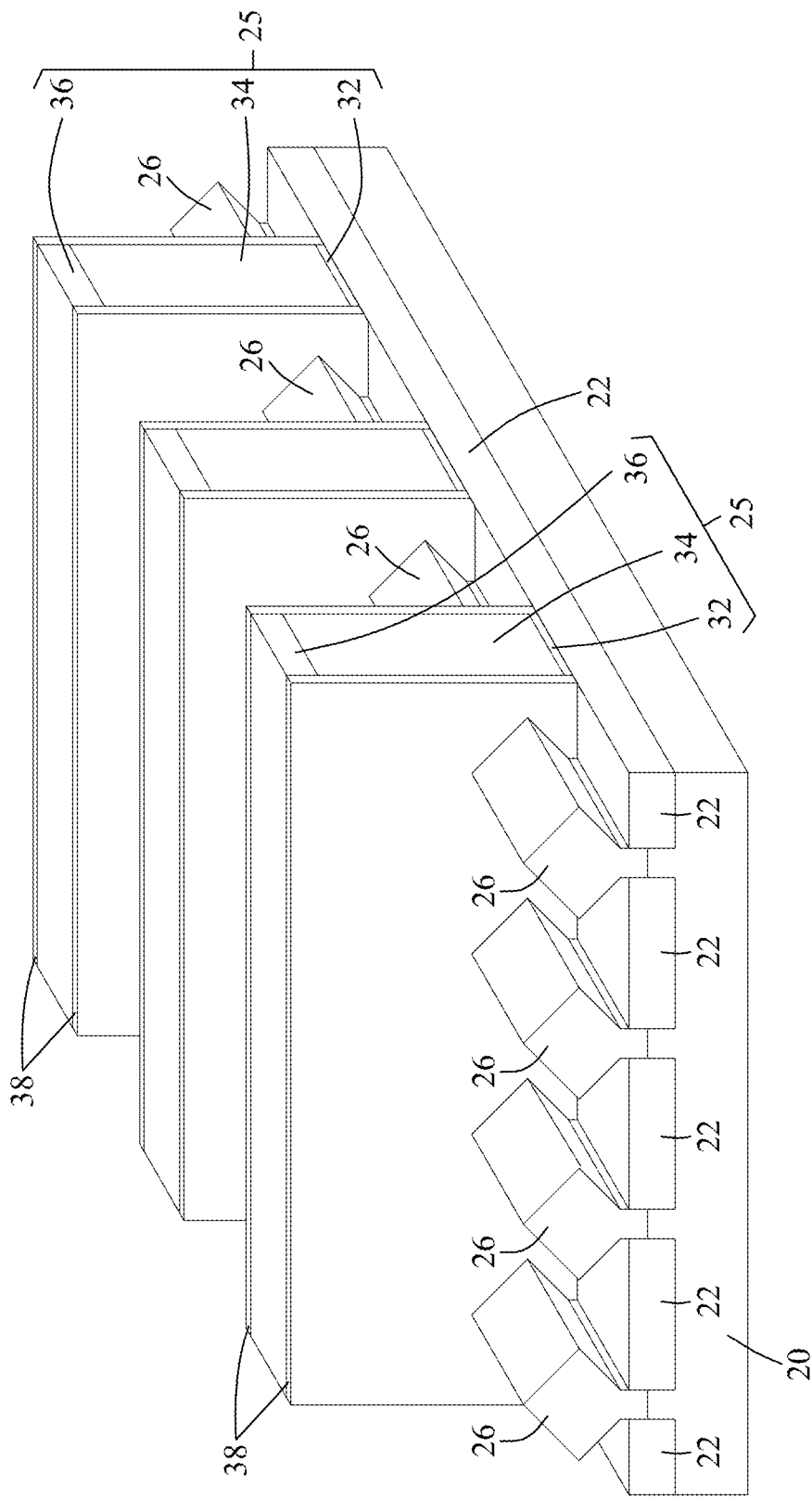

Referring to FIGS. 1A and 8, the method 100 proceeds to step 107, where epitaxy regions 26 (source/drain regions) are formed in the recesses 240 through a selective epitaxial growth process (SEG) process. In some embodiments, the epitaxy regions 26 include crystalline silicon (or other suitable materials) in-situ doped with an n-type impurity or a p-type impurity during the SEG process depending on whether the FinFET is a p-type FinFET or an n-type FinFET, respectively. When the FinFET is an n-type FinFET, the n-type impurity may be, for example, but not limited to, phosphorous, nitrogen, arsenic, antimony, other suitable materials, or combinations thereof, and in some embodiments, silicon phosphorous (SiP) or silicon carbon phosphorous (SiCP) may be grown as the epitaxy regions 26. On the other hand, when the FinFET is a p-type FinFET, The p-type impurity may be, for example, but not limited to, germanium, boron, aluminum, gallium, indium, $BF_2$, other suitable materials, or combinations thereof, and in some embodiments, silicon germanium boron (SiGeB) may be grown as the epitaxy region. In accordance with alternative embodiments of the present disclosure, epitaxy regions include III-V compound semiconductors such as GaAs, InP, GaN, InGaAs, InAlAs, GaSb, AlSb, AlAs, AlP, GaP, combinations thereof, or multi-layers thereof. After step 107, channel regions are defined among the epitaxy regions 26. Each of the epitaxy regions 26 may include one or multiple layers. For the epitaxy regions 26 that include multiple layers, an outermost layer thereof may serve as a sacrificial layer.

Figure 9:
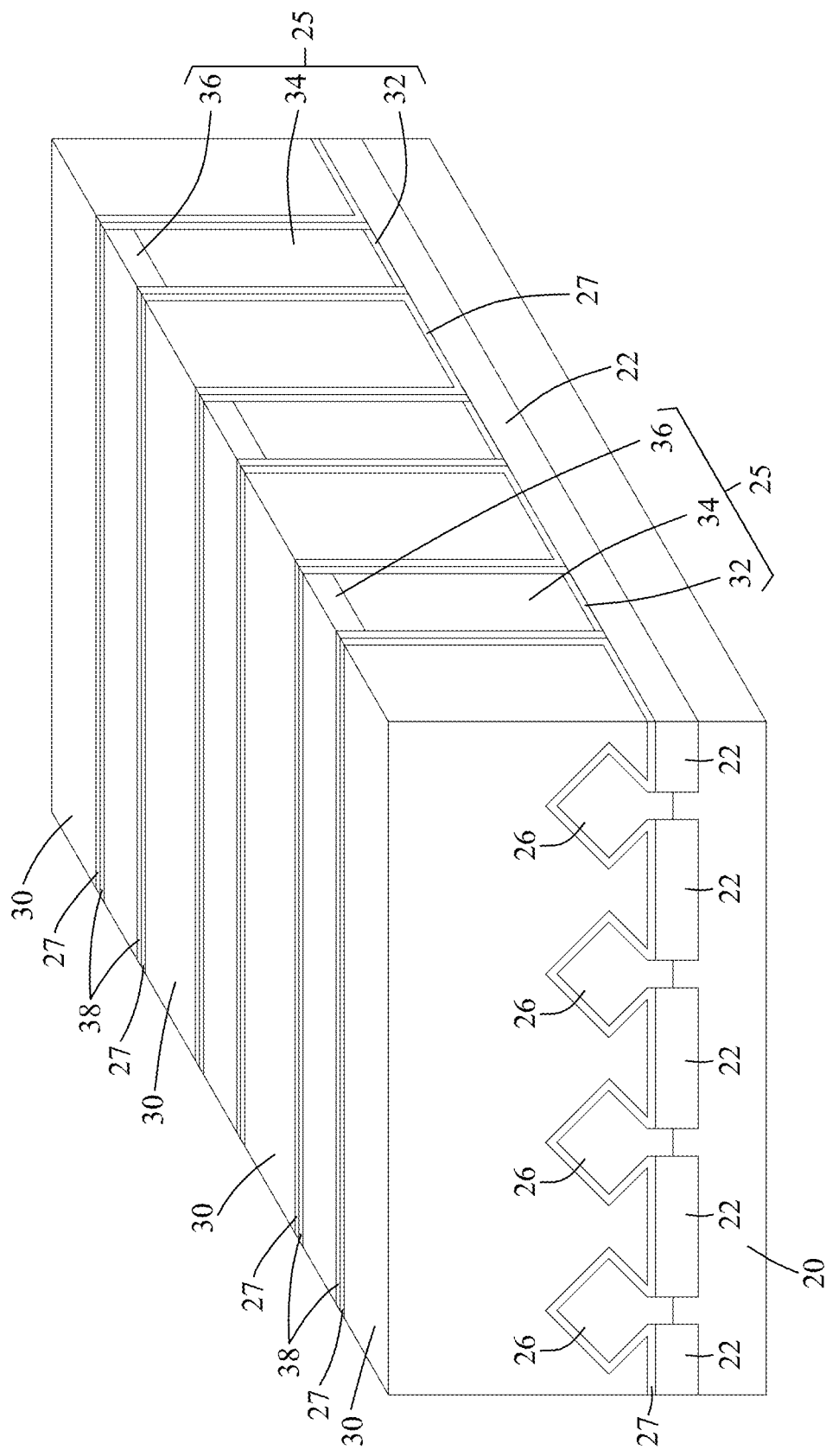

Referring to FIGS. 1A and 9, the method 100 proceeds to step 108, where a contact etch stop layer (CESL) 27 is formed over a structure shown in FIG. 8, an interlayer dielectric (ILD) layer 30 is formed over the CESL 27, and the ILD layer 30 is planarized. The CESL 27 may include, for example, but not limited to, silicon nitride, carbon-doped silicon nitride, other suitable materials, or combinations thereof, and may be formed using a blanket deposition process, such as, but not limited to, chemical vapor deposition (CVD), sub-atmospheric CVD (SACVD), molecular layer deposition (MLD), atomic layer deposition (ALD), plasma enhanced atomic layer deposition (PEALD), other suitable methods, or combinations thereof. In certain embodiments, the CESL 27 is conformally formed on the epitaxy regions 26, the isolation regions 22, the spacers 38 and the dummy gate stacks 25. The ILD layer 30 may include a dielectric material such as, but not limited to, silicon oxide, a low-k material, other suitable materials, or combinations thereof. The ILD layer 30 may be formed by blanket depositing a layer of the dielectric material using, for example, but not limited to, CVD, HDPCVD, SACVD, MLD, flowable chemical vapor deposition (FCVD), spin-on coating, other suitable methods, or combinations thereof. The ILD layer 30 is planarized by using, for example, but not limited to, chemical mechanical polishing (CMP), other suitable methods, or combinations thereof, to expose the dummy gate hard masks 36 of the dummy gate stacks 25, and the gate spacers 38.

Figure 10:
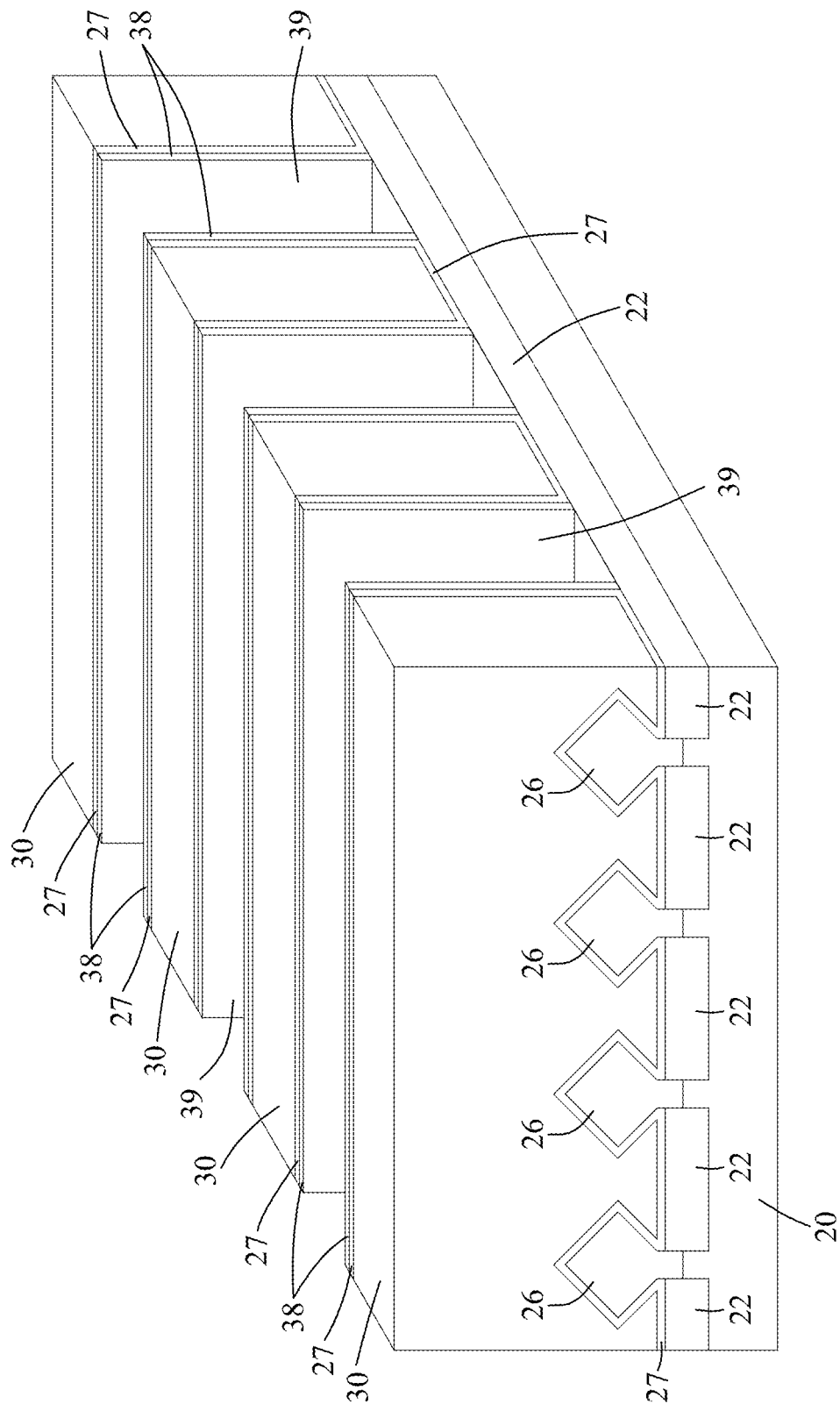

Referring to FIGS. 1A and 10, the method 100 proceeds to step 109, where for each of the dummy gate stacks 25, the dummy gate hard mask 36, the dummy gate electrode 34 and the dummy gate dielectric layer 32 as shown in FIG. 9 are removed, so as to form recesses 39 as shown in FIG. 10. Top surfaces of the semiconductor fins 24 originally underneath the dummy gate stacks 25 (see FIGS. 4 and 5) are exposed from the recesses 39 (not shown in FIG. 10). Step 109 may be implemented through a known etching process in the art, such as, but not limited to, a dry etching process, a wet etching process, other suitable processes, or combinations thereof.

Figure 11:
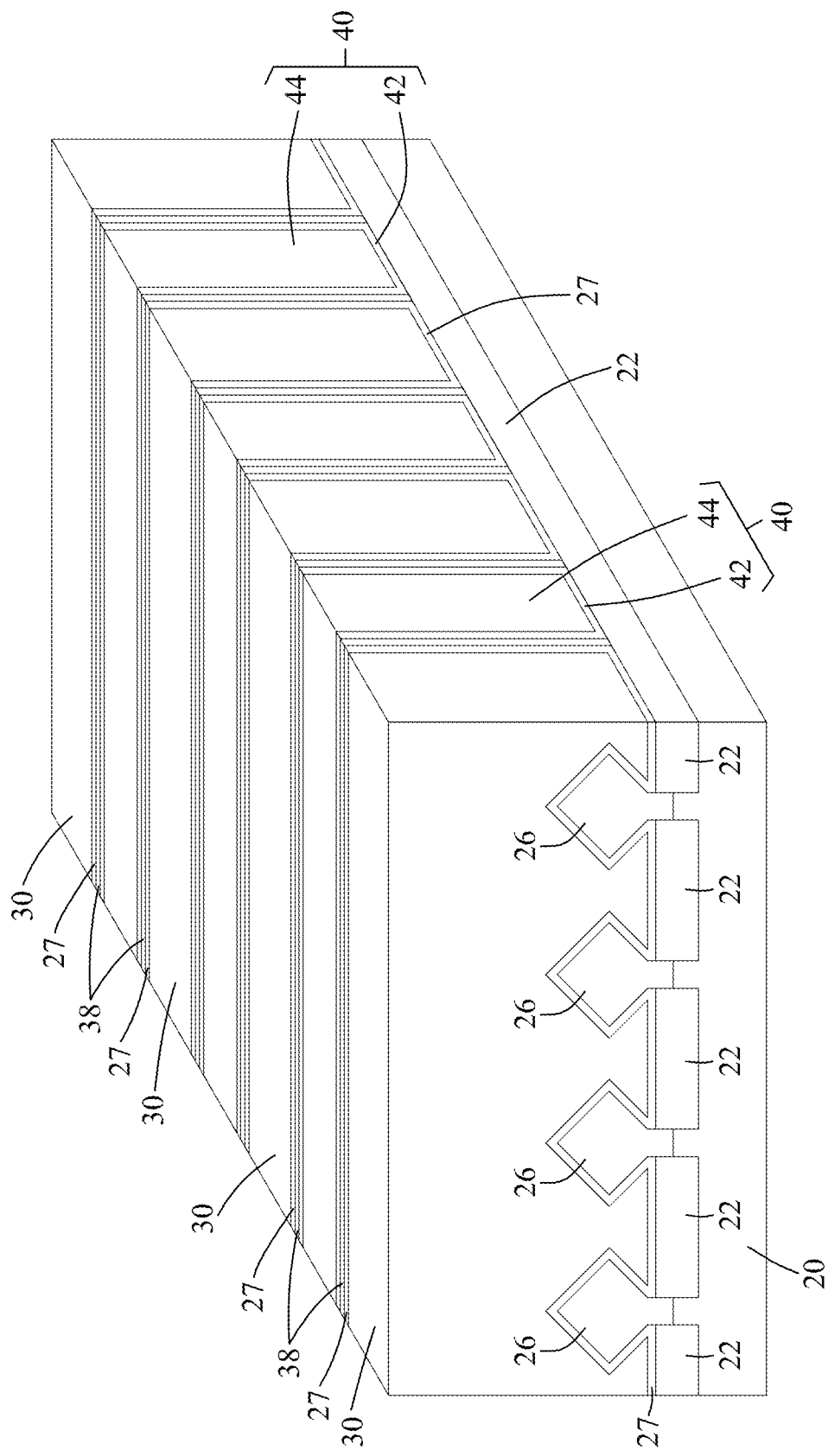

Referring to FIGS. 1A and 11, the method 100 proceeds to step 110, where a gate dielectric layer 42 and a gate electrode 44 are sequentially formed over the top surface of the ILD layer 30 and to fill in the recesses 39 through a blanket deposition process using CVD, HDPCVD, SACVD, MLD, physical vapor deposition (PVD), ALD, sputtering, other suitable methods, or combinations thereof, followed by a planarization process so as to form metal gates 40 in the recesses 39. Each of the metal gates 40 includes the gate dielectric layer 42 and the gate electrode 44. Top surfaces of the metal gates 40 are level with the top surface of the ILD layer 30.

The gate dielectric layer 42 may include, from interior to exterior, an interlayer dielectric sublayer (which may include, but not limited to, silicon oxide, silicon nitride, silicon oxynitride, other suitable materials, or combinations thereof) and a sublayer of high dielectric constant (k) material, such as, but not limited to, hafnium oxide, lanthanum oxide, aluminum oxide, zirconium oxide, or other suitable materials. The gate electrode 44 may include, from interior to exterior, a barrier layer (not shown, which may prevent diffusion of a metal into the gate dielectric layer and may include aluminum, titanium, tantalum, other suitable materials, or combinations thereof), a work function layer (not shown), and a filling material layer (not shown, which may include, but not limited to, aluminum, tungsten, copper, other conductive metals, or combinations thereof). Material of the work function layer may be selected according to whether the FinFET is an n-type FinFET or a p-type FinFET. For the n-type FinFET, the work function layer is an n-type work function layer which may include, but are not limited to materials such as, titanium, aluminum, tantalum carbide, tantalum carbide nitride, tantalum silicon nitride, other suitable materials, or combinations thereof. For the p-type FinFET, the work function layer is an p-type work function layer which may include, but are not limited to materials such as, titanium nitride, tantalum nitride, ruthenium, molybdenum, tungsten, platinum, other suitable materials, or combinations thereof.

Figure 12:
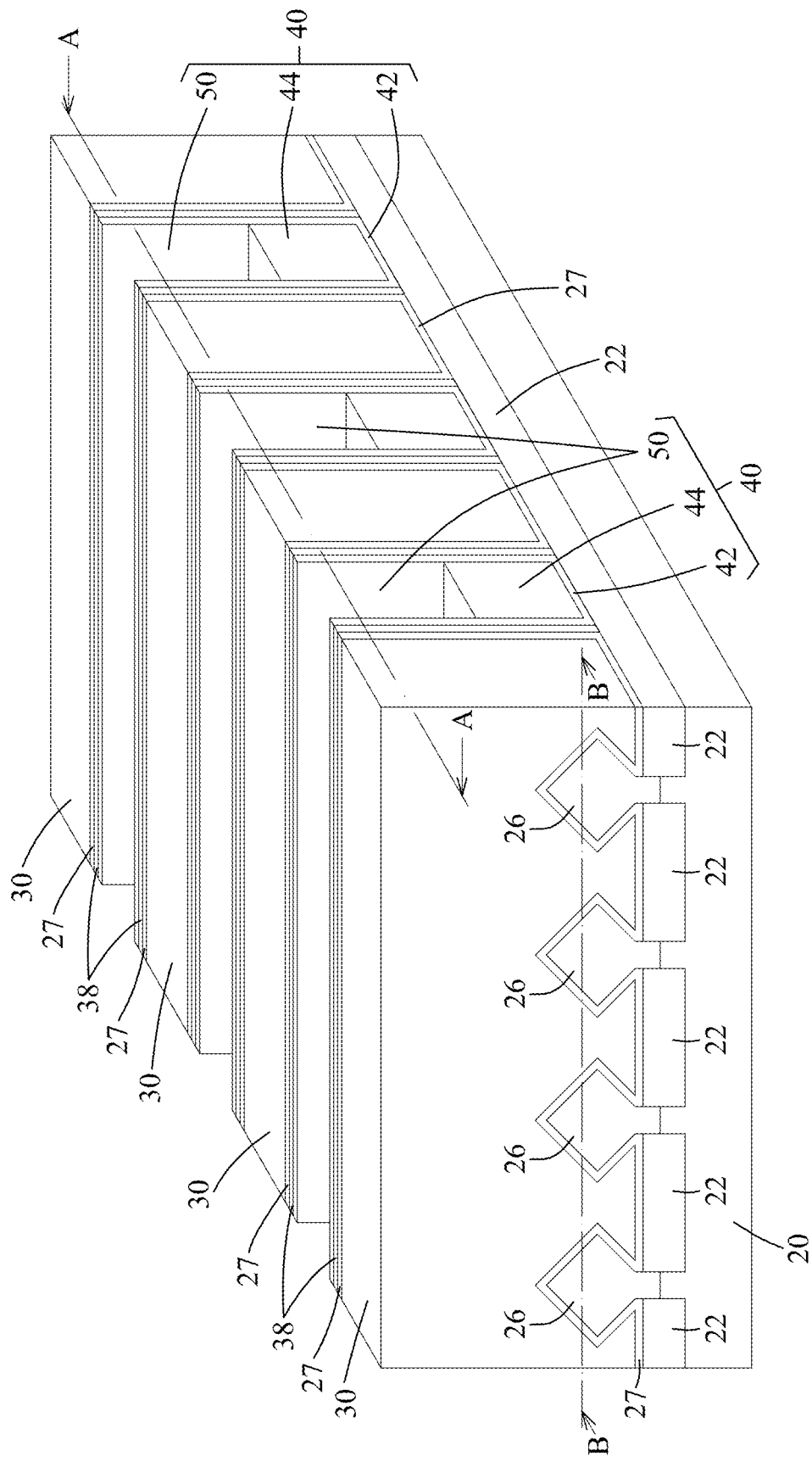

Referring to FIGS. 1B and 12, the method 100 proceeds to step 111, where for each of the metal gates 40, the gate electrode 44 is recessed through an etch-back process to form a gate recess 50. The etch-back process may be implemented by, for example, but not limited to, a dry etching process, a wet etching process, other suitable processes, or combinations thereof. In some embodiments, the etch-back process is performed using an etchant that attacks the gate electrodes 44, but doesn't attack the gate dielectrics 42, the gates spacers 38 and the ILD layer 30. In some embodiment, the etchant may be implemented by, but is not limited to, a chlorine-based or fluorine-based etchant.

Figure 13:
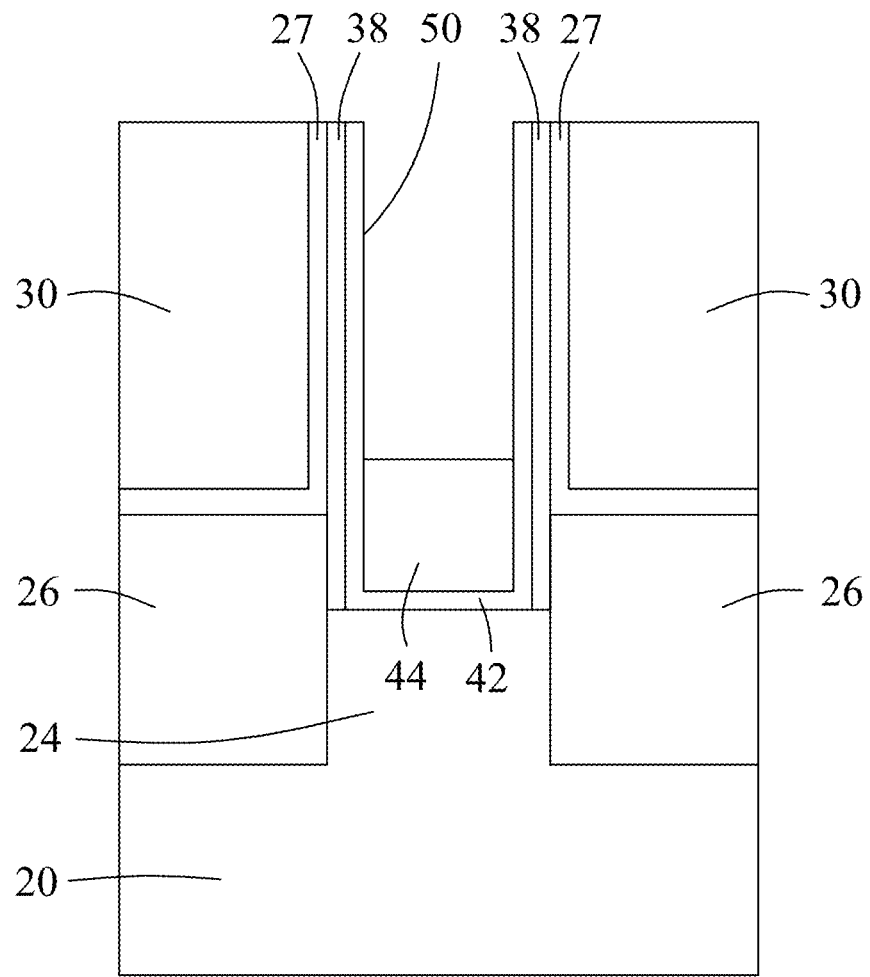
Figure 14:
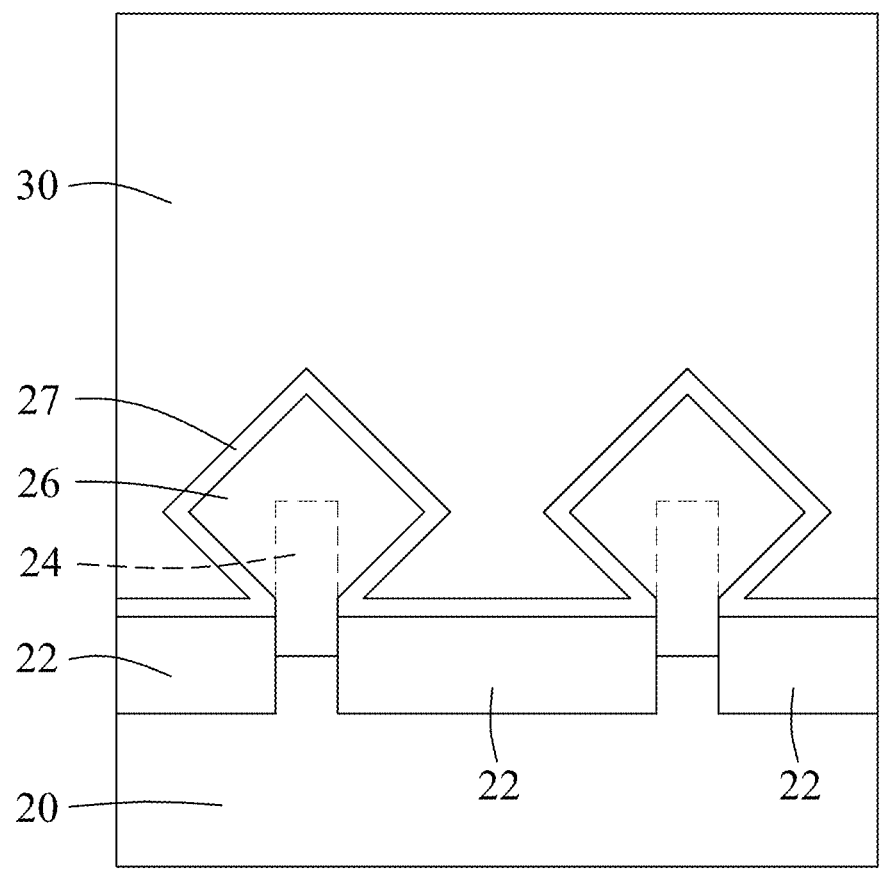
Figure 15:
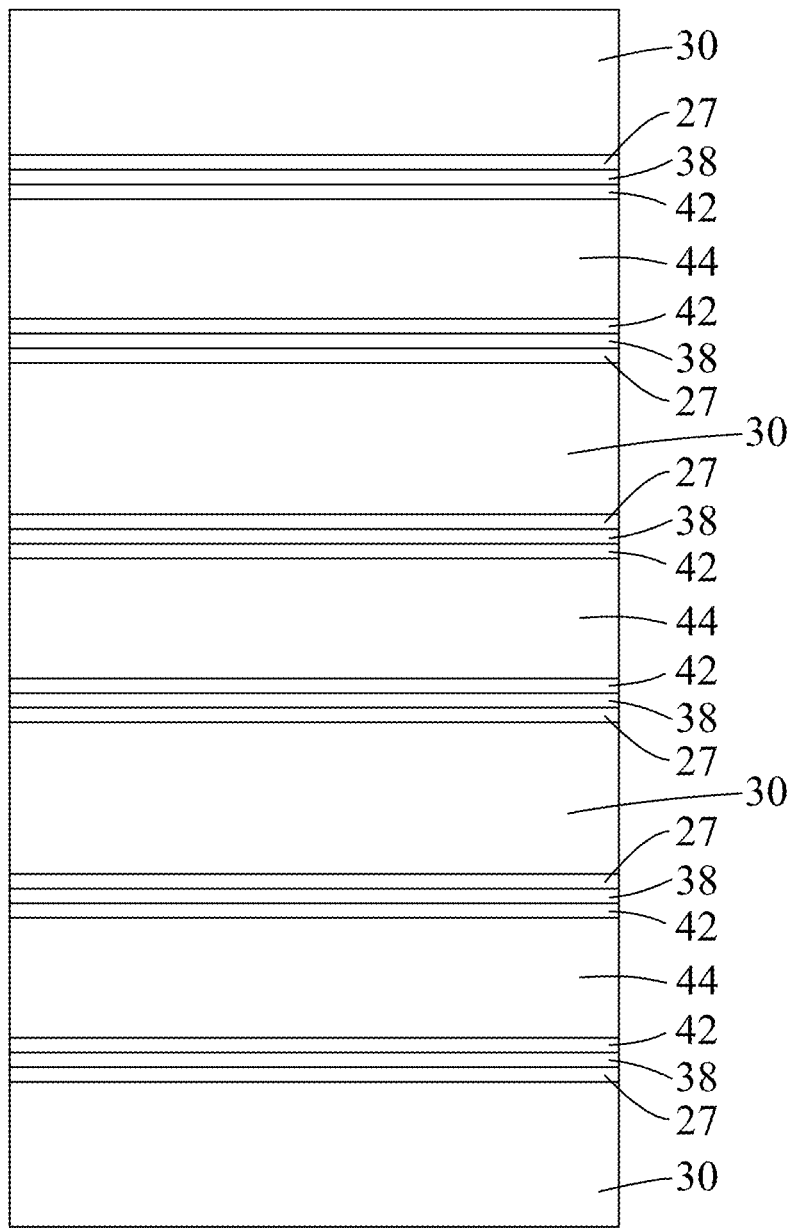

FIG. 13 is a partial cross-sectional view of a structure shown in FIG. 12, and the partial cross-sectional view is taken along the line A-A in FIG. 12. The partial cross-sectional view of FIG. 13 illustrates one of the metal gates 40 and two of the epitaxy regions 26 on opposite sides of the one of the metal gates 40. FIG. 14 is a partial cross-sectional view of the structure shown in FIG. 12, and the partial cross-sectional view is taken along the line B-B in FIG. 12. The partial cross-sectional view of FIG. 14 illustrates two of the semiconductor fins 24 and two of the epitaxy regions 26. FIG. 15 is a top view of the structure shown in FIG. 12.

Figure 16:
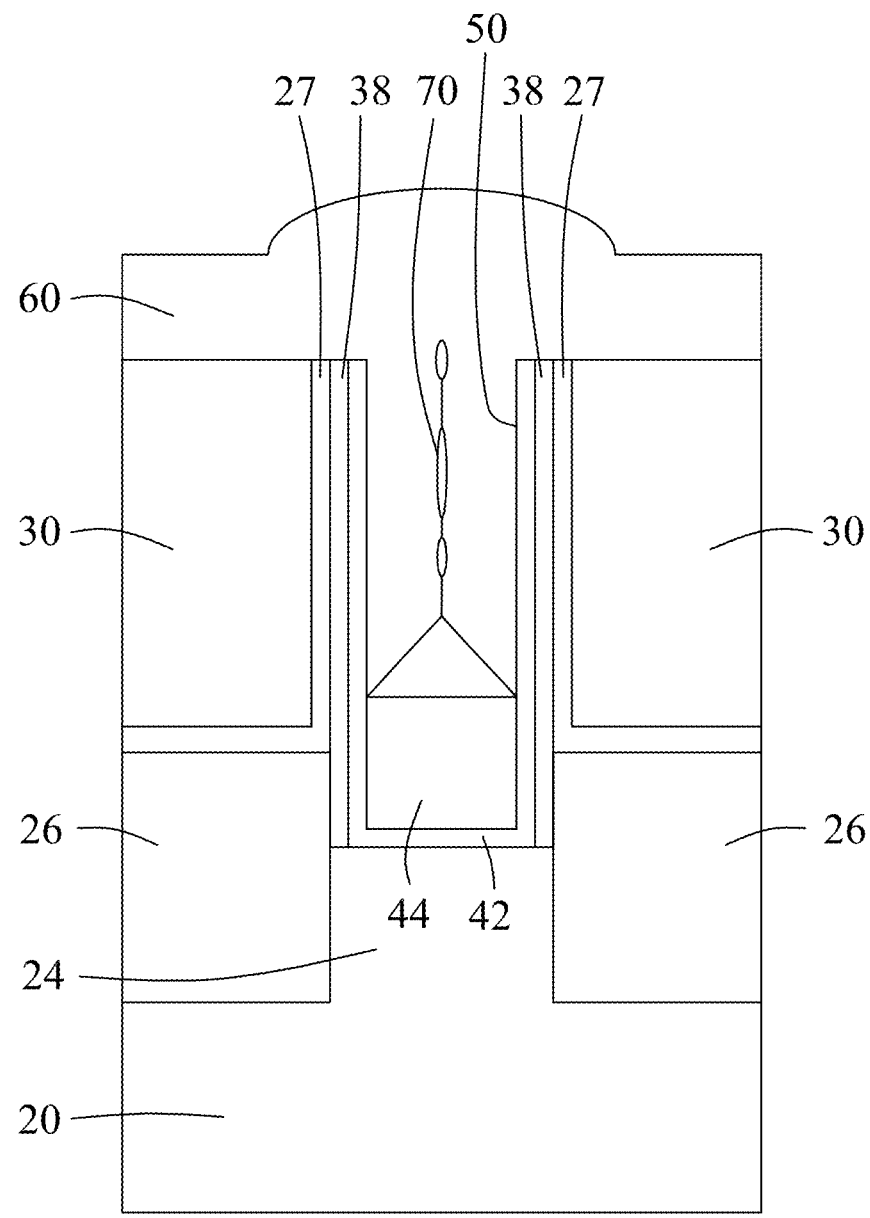
Figure 17:
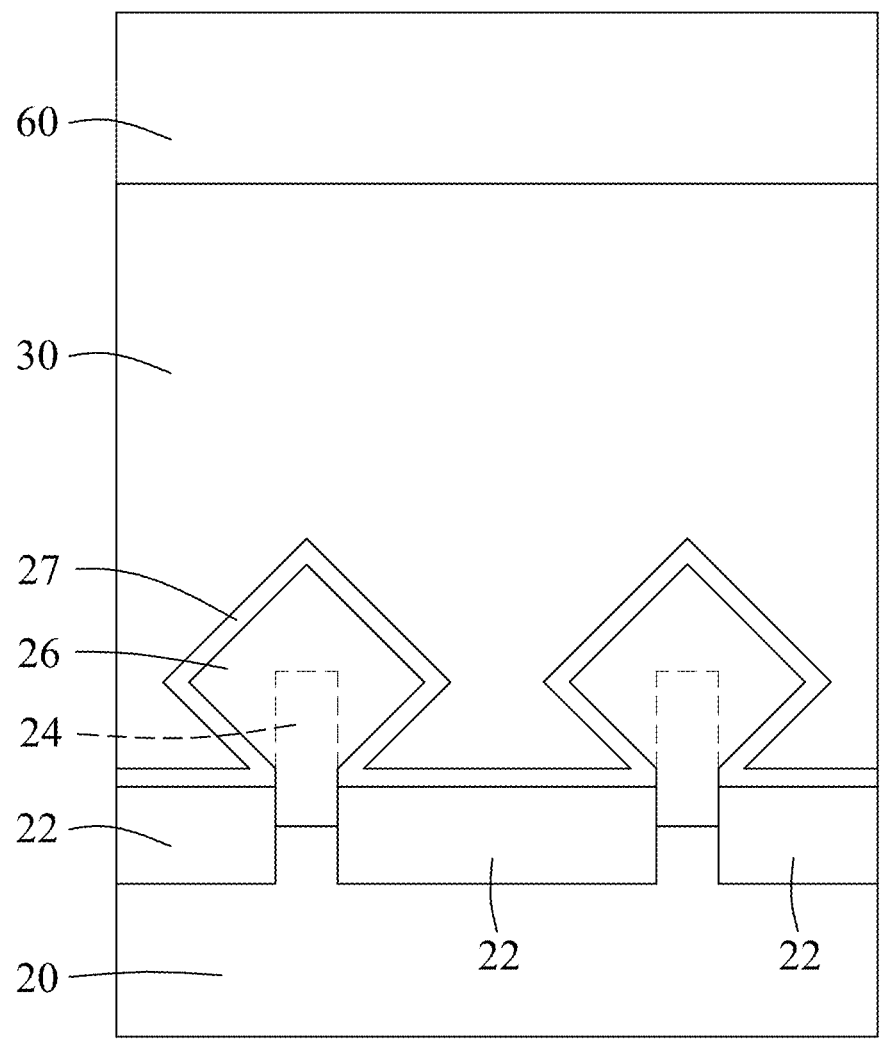
Figure 18:
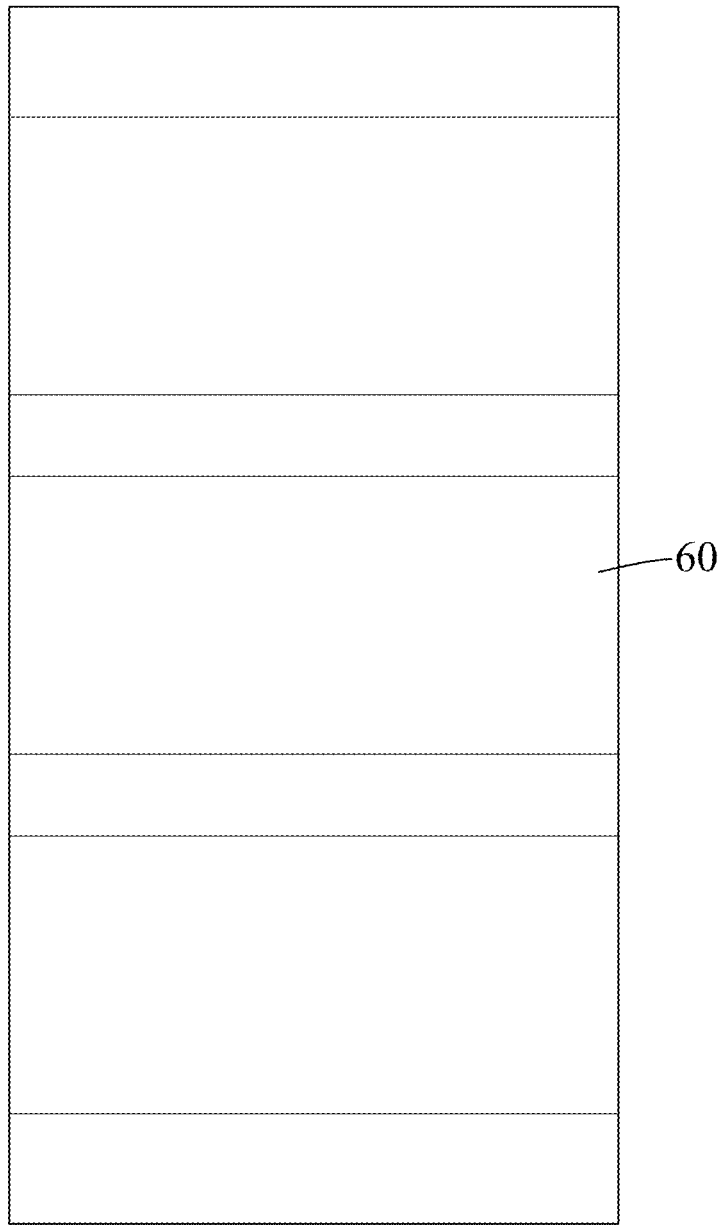

Referring to FIGS. 1B and 16-18, the method 100 proceeds to step 112, where a self-aligned contact (SAC) film 60 is formed on the ILD layer 30 and fills the gate recess 50 of each of the metal gates 40. FIGS. 16-18 are viewed from the same perspectives as FIGS. 13-15, respectively. In some embodiments. The SAC film 60 may include a material which has an etch rate different from (e.g., lower than) the dielectric material of the ILD layer 30. The material for the SAC film 60 may include, for example, but not limited to, silicon nitride, silicon carbon nitride, silicon oxycarbide, silicon oxycarbonitride, other suitable materials, or combinations thereof. The SAC film 60 may be conformally deposited by, for example, but not limited to, ALD, PEALD, plasma-enhanced chemical vapor deposition (PECVD), PVD, sputtering, plating, other suitable techniques, or combinations thereof. In some embodiments, when the SAC film 60 is conformally formed to fill the gate recesses 50, because the gate recesses 50 may be formed with wiggling edges (not shown) when viewed from the top, undesirable seams 70 (or voids) may be formed in the SAC film 60 filling the gate recesses 50. In some embodiments, the seams 70 may have dimensions ranging from about 0.5 nanometer to about 2 nanometers.

Figure 19:
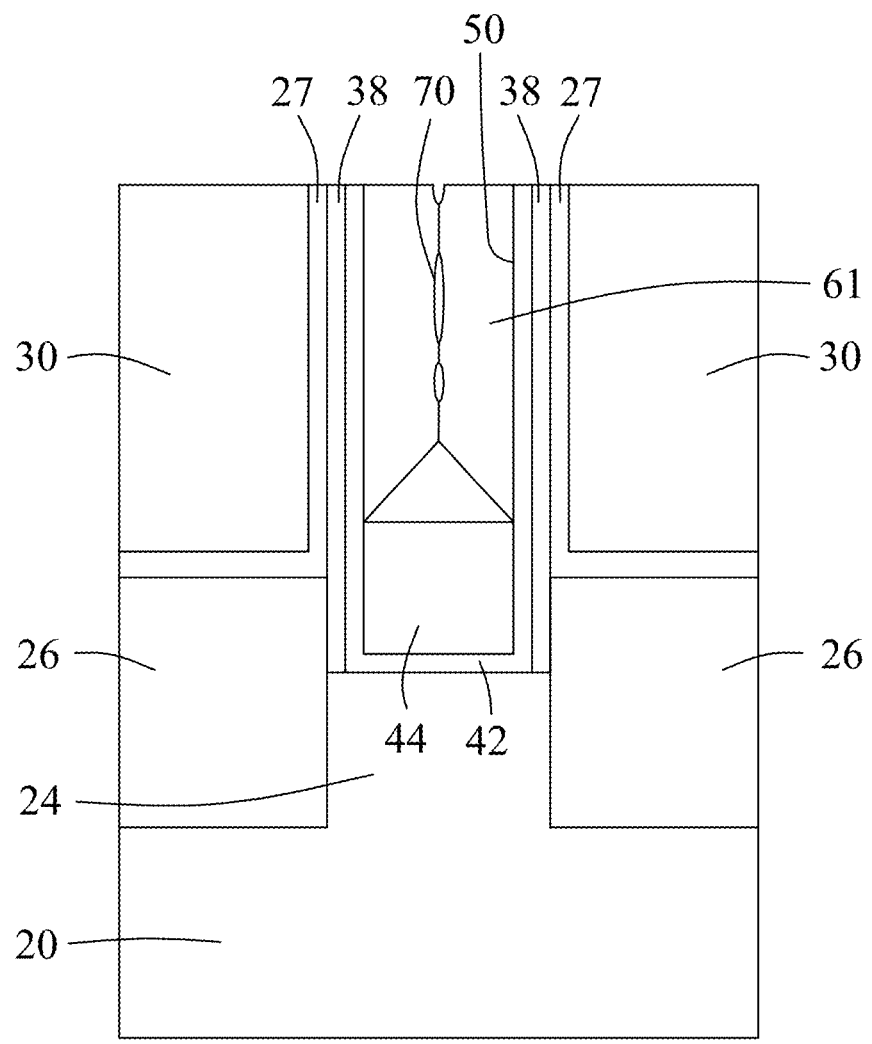
Figure 20:
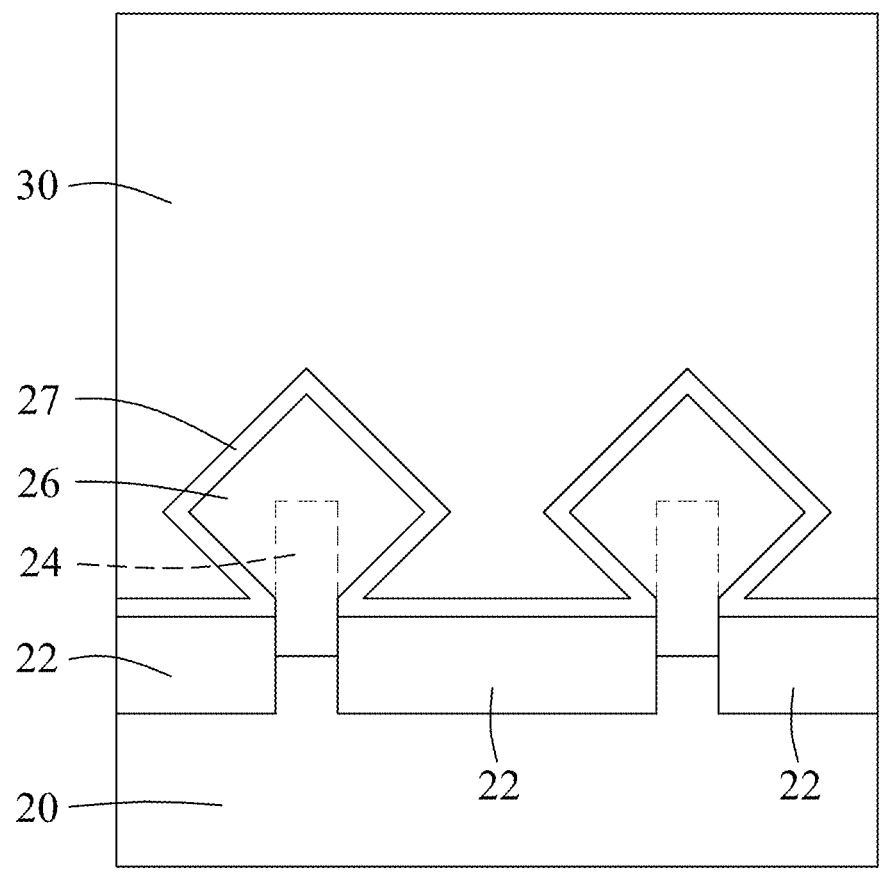
Figure 21:
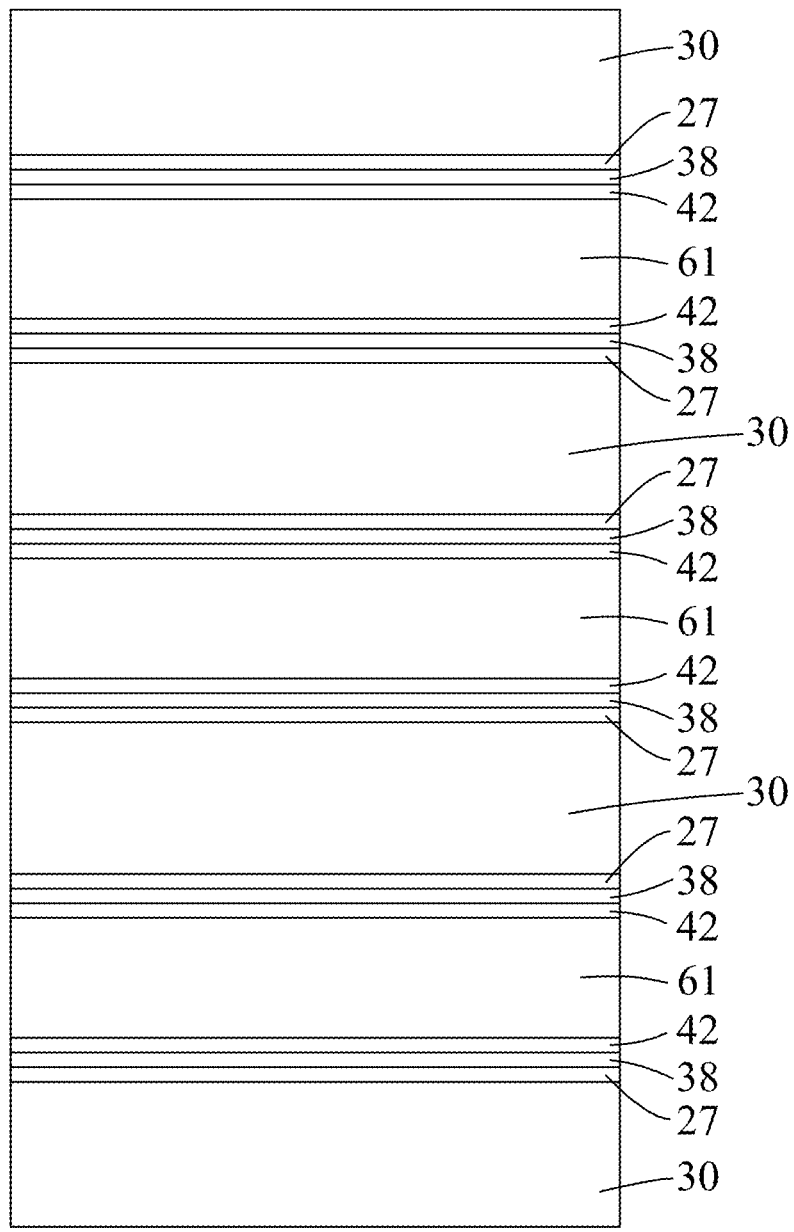

Referring to FIGS. 1B and 19-21, the method 100 proceeds to step 113, where a planarization process is conducted to remove the excess of the SAC film 60 on the ILD layer 30 outside the gate recess 50 shown in FIG. 16, so as to obtain a SAC layer 61 in the gate recess 50 of each of the metal gates 40. FIGS. 19-21 are viewed from the same perspectives as FIGS. 16-18, respectively. In some embodiments, the SAC layer 61 may serve as an isolation layer or an etch-stop layer for a subsequent MD (an abbreviation for "metal-to-device") etching process to protect the gate electrode 44 underneath the SAC layer 61. Step 113 may be implemented using a CMP process or other suitable techniques. In some embodiments, top surfaces of the SAC layers 61 may be coplanar with the top surface of the ILD layer 30 and with top surfaces of the gate spacers 38. The seams 70 originally formed in the SAC film 60 remain in the SAC layers 61.

Figure 22:
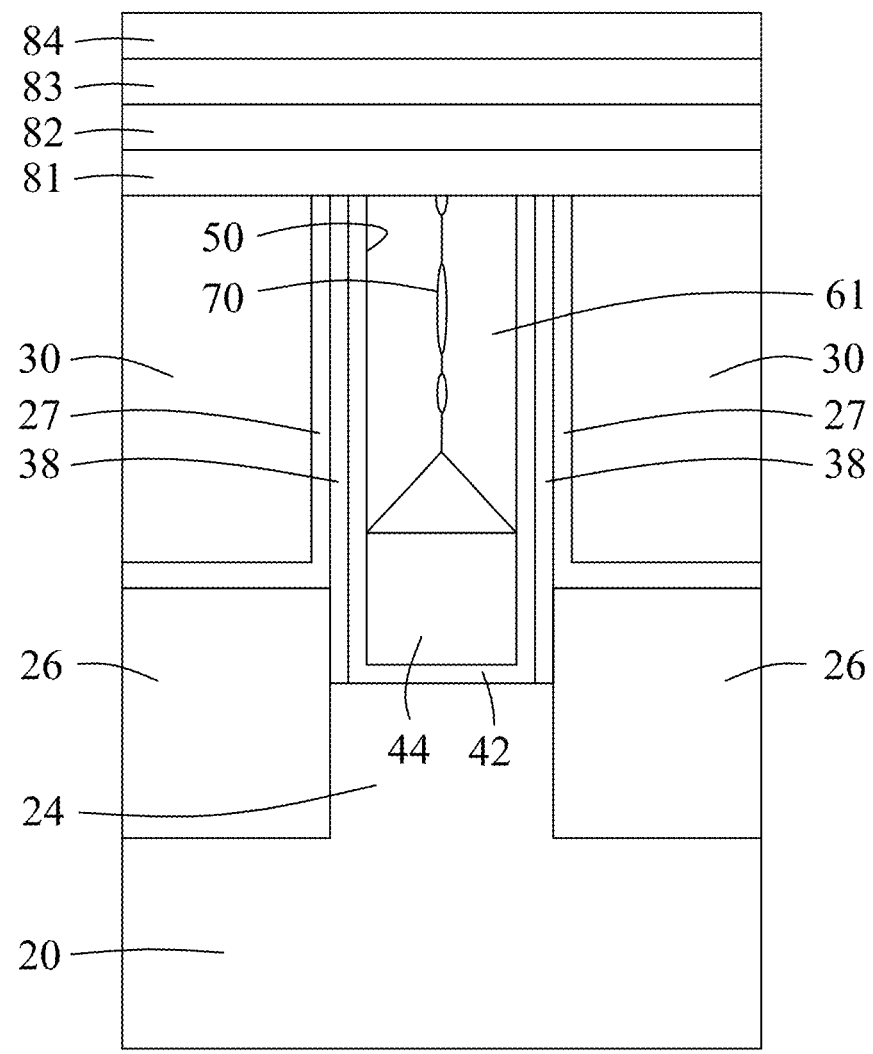
Figure 23:
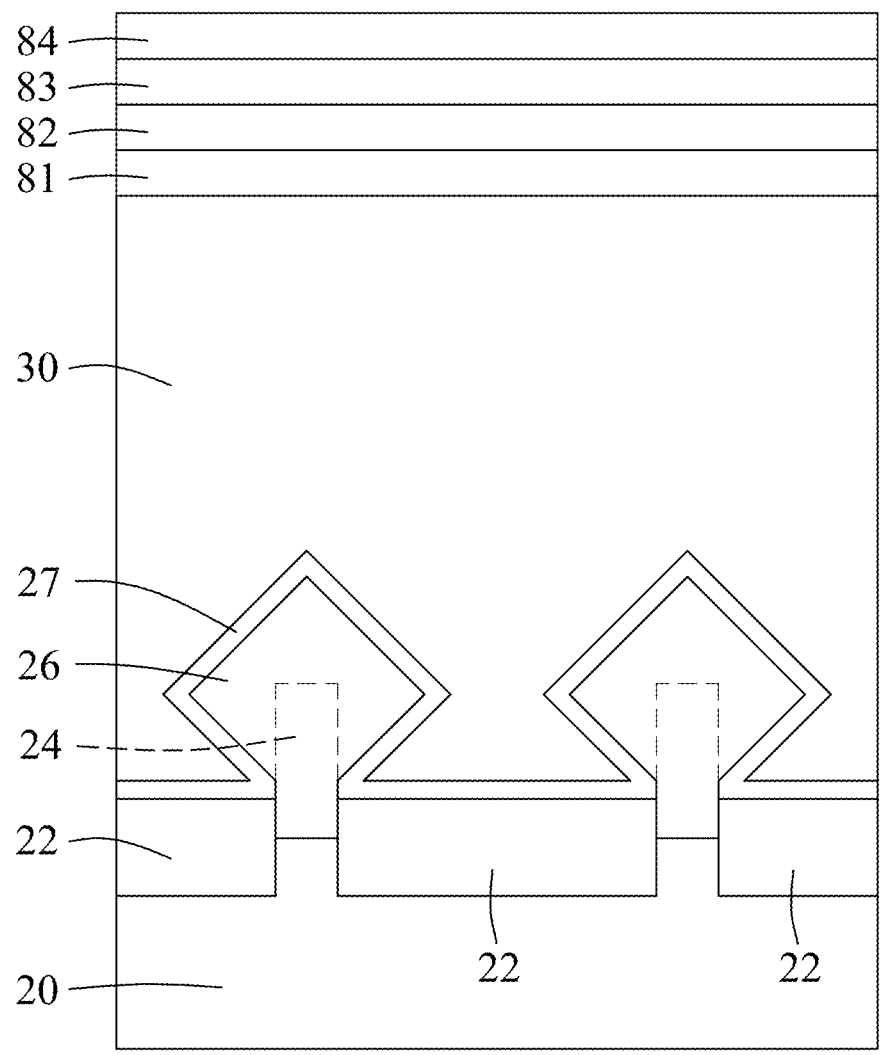
Figure 24:
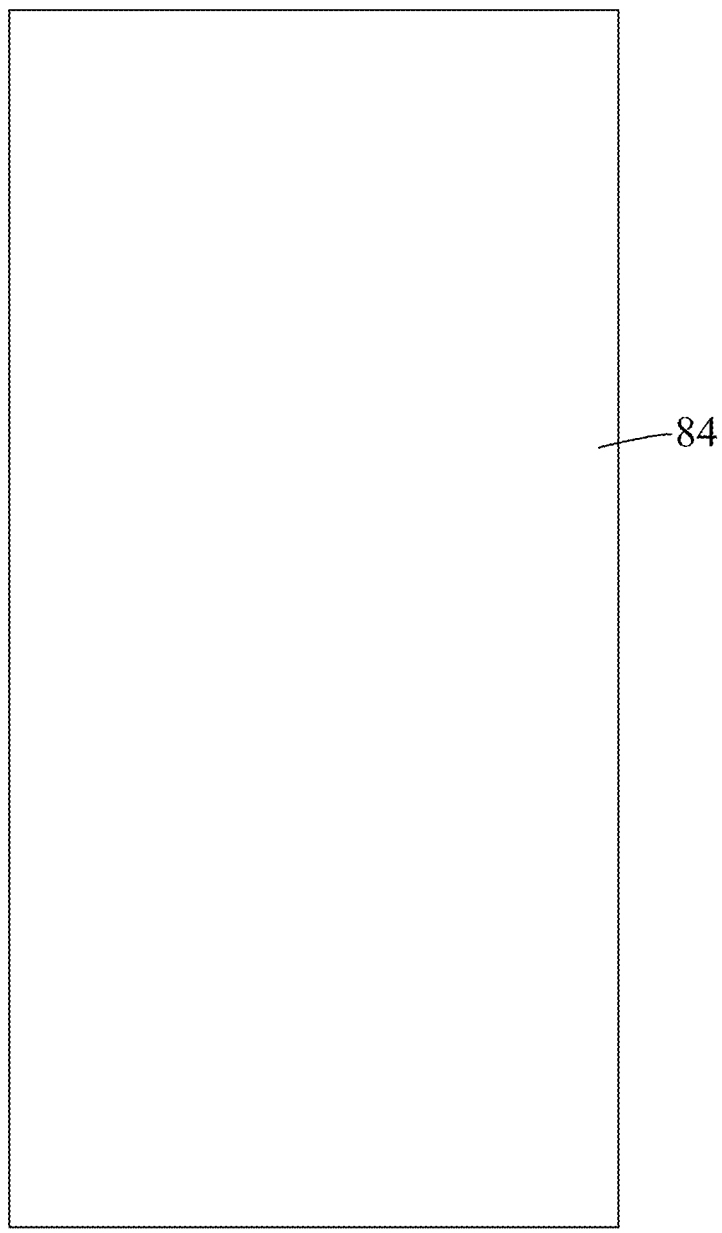

Referring to FIGS. 1B and 22-24, the method 100 proceeds to step 114, where a first oxide film 81, a tungsten carbide film 82, a second oxide film 83 and a silicon film 84 are sequentially formed over a structure shown in FIGS. 19-21 through a deposition process using PECVD, SACVD, MLD, ALD, other suitable methods, or combinations thereof. FIGS. 22-24 are viewed the same perspectives as FIGS. 19-21, respectively. In some embodiment, materials for the first oxide film 81 and the second oxide film 83 may include, but not limited to, silicon dioxide or other suitable materials.

Figure 25:
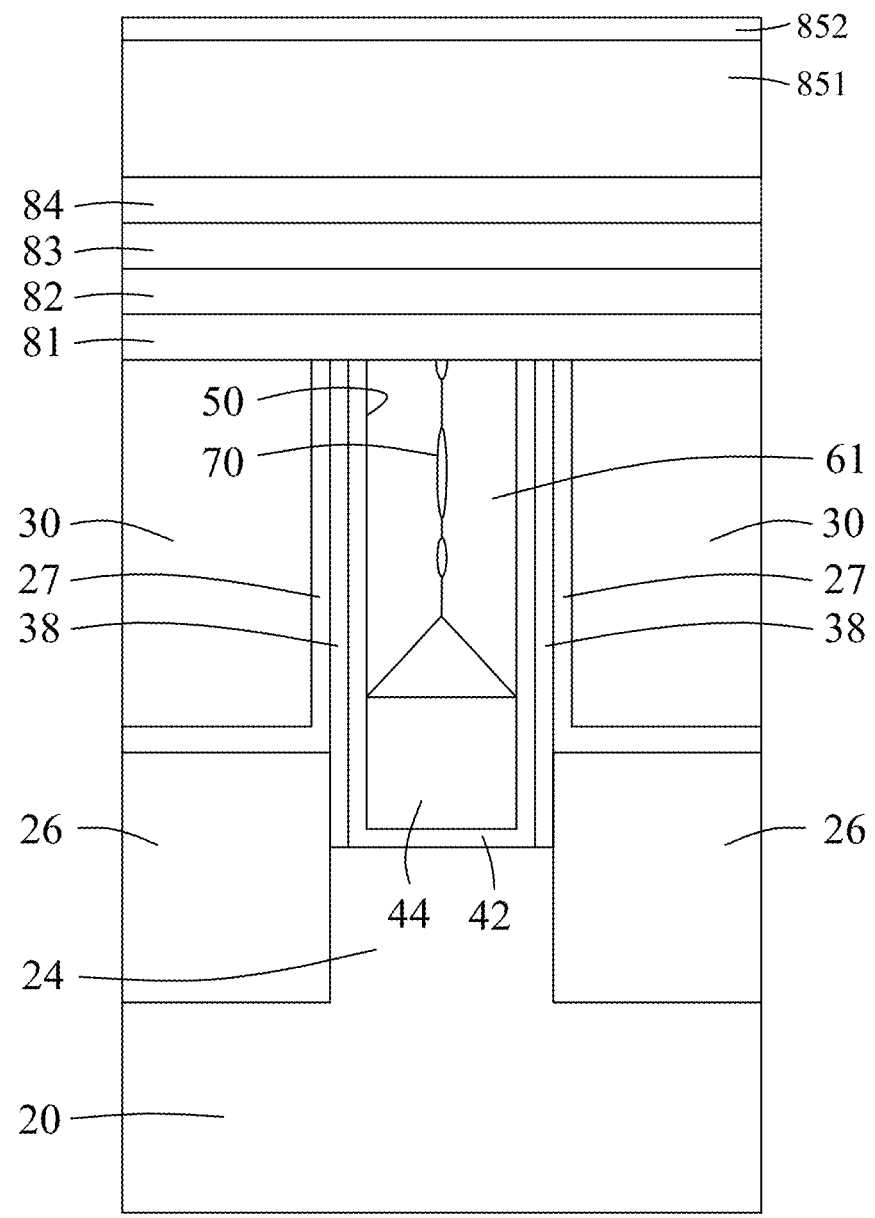
Figure 26:
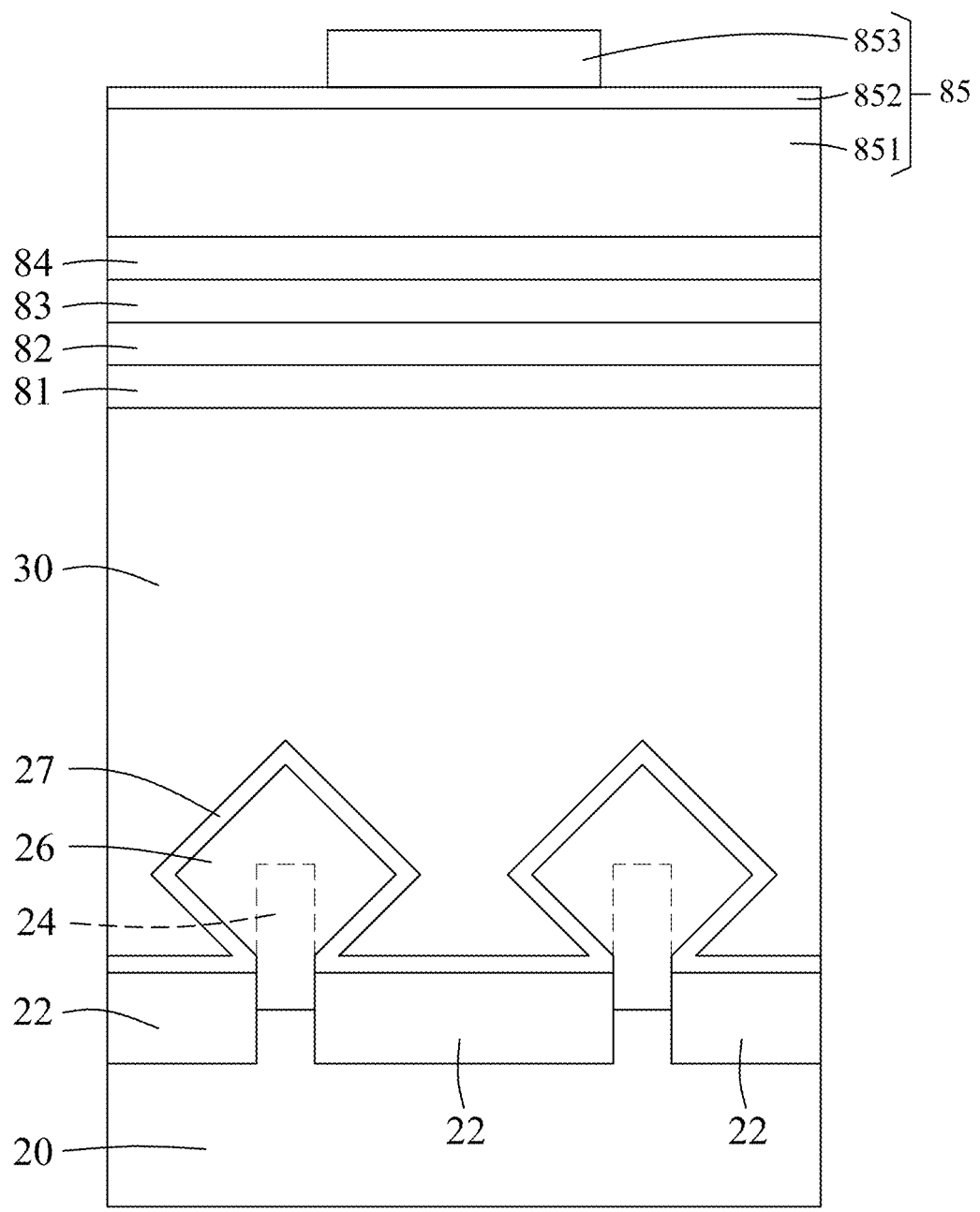
Figure 27:
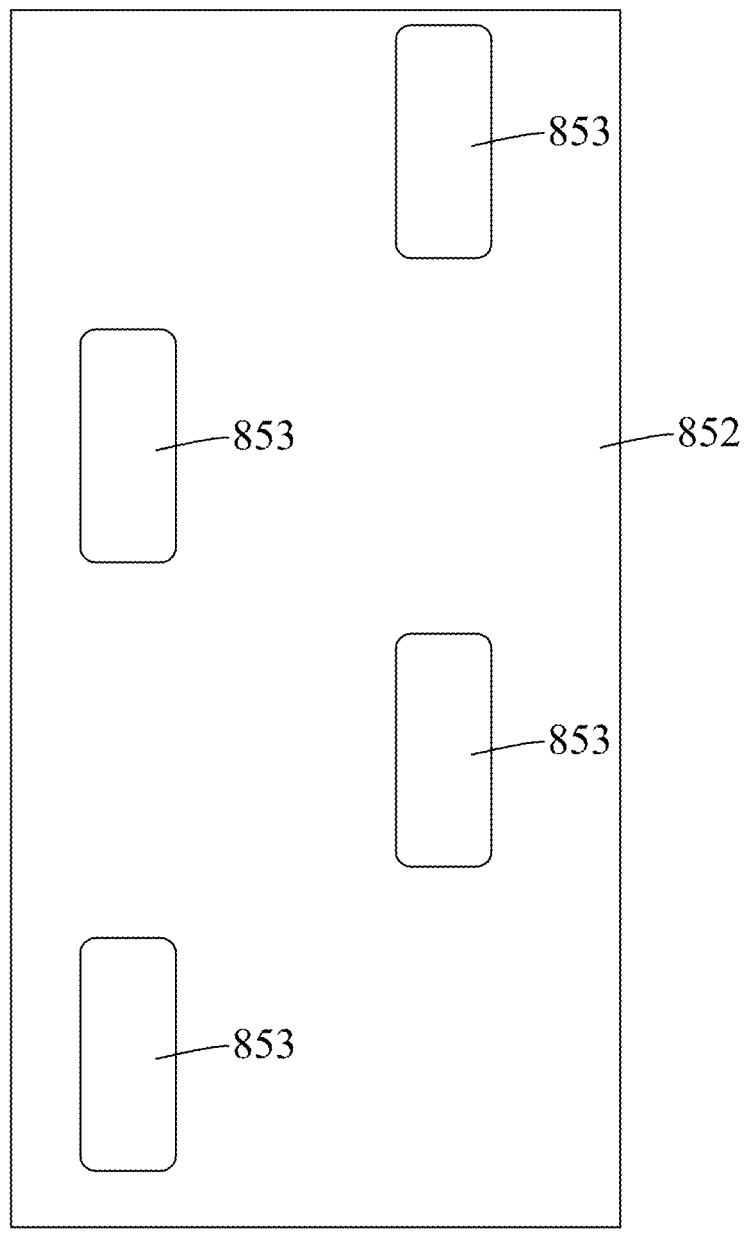

Referring to FIGS. 1B and 25-27, the method 100 proceeds to step 115, where a photoresist is applied and patterned to form a patterned photoresist 85 on the silicon film 84. FIGS. 25-27 are viewed from the same perspectives as FIGS. 22-24, respectively. The patterned photoresist 85 covers several portions of the silicon film 84 each corresponding in position to a portion between two nearby semiconductor fins 24 (see FIG. 26), and has a shape of multiple isles from the top view of FIG. 27. Step 115 may be implemented using a photolithography process. The photolithography process may include, for example, but not limited to, coating a photoresist, soft-baking, exposing the photoresist through a photomask, post-exposure baking, and developing the photoresist, followed by hard-baking, so as to form a patterned photoresist 85.

The patterned photoresist 85 may include, from bottom to top, a bottom layer 851, a middle layer 852 and a top photoresist layer 853. The bottom layer 851 may include a material such as, but not limited to, a material containing carbon, hydrogen and oxide, other suitable materials, or combinations thereof. The middle layer 852 may include, but not limited to a material such as, silicon oxide, silicon nitride, silicon oxynitride, other suitable materials, or combinations thereof. The top photoresist layer 853 may include a material that includes carbon, hydrogen and oxygen, other suitable materials, or combinations thereof. In certain embodiments, formations of the bottom layer 851, the middle layer 852 and the top photoresist layer 853 may be implemented using CVD, spin-on coating, PECVD, other suitable techniques, or combinations thereof.

Figure 28:
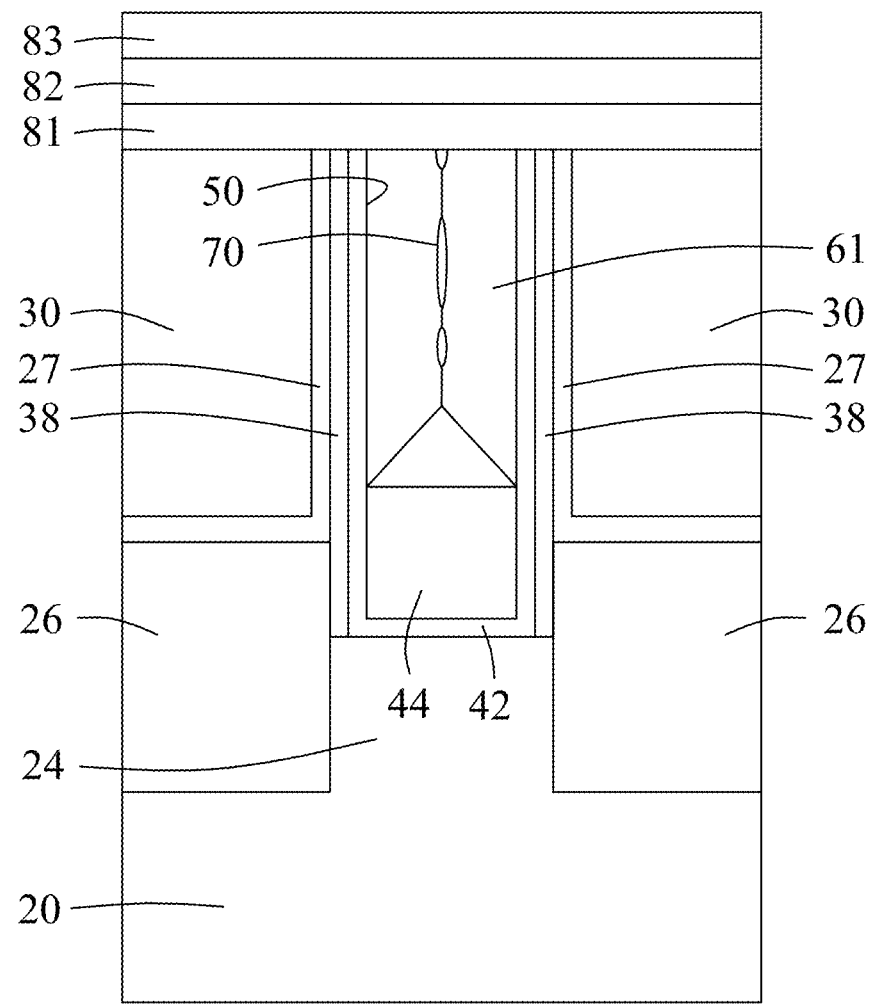
Figure 29:
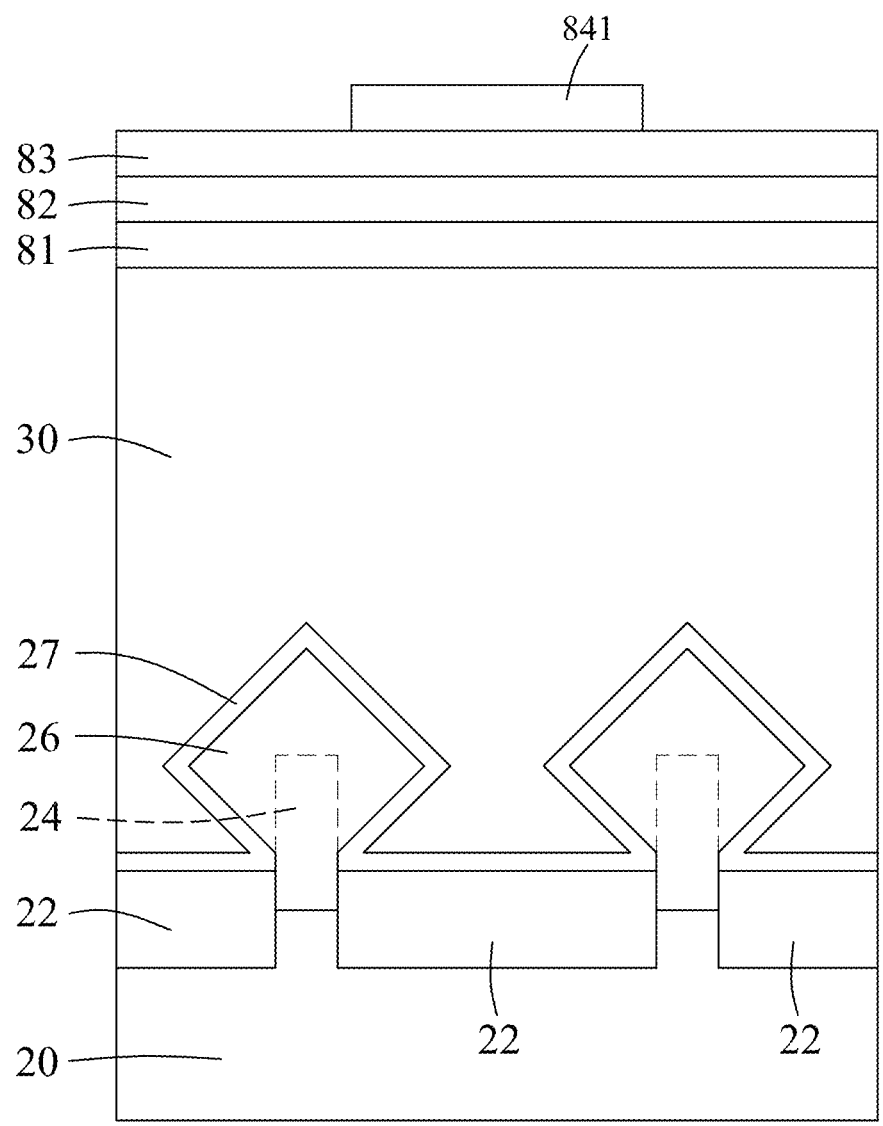
Figure 30:
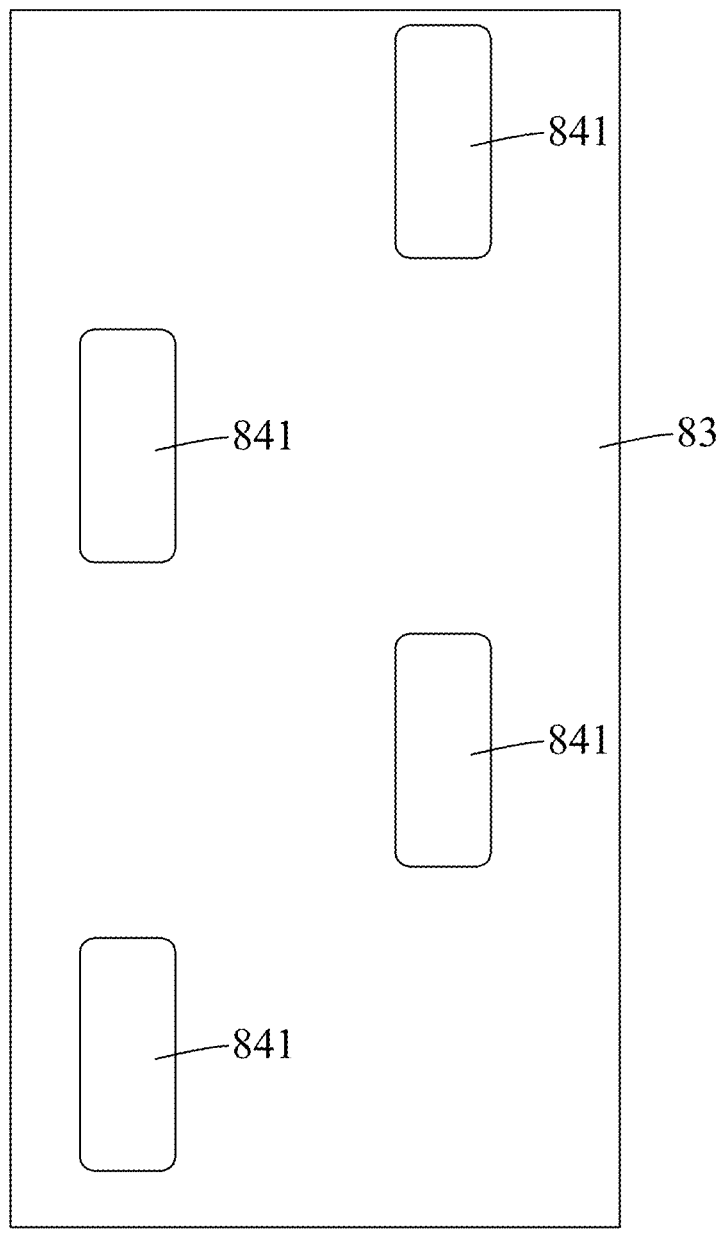

Referring to FIGS. 1B and 28-30, the method 100 proceeds to step 116, where an etching process is conducted to pattern the silicon film 84 so as to form silicon caps 841 (known as cut MD) on the second oxide film 83. FIGS. 28-30 are viewed from the same perspectives as FIGS. 25-27, respectively. The etching process may be implemented by etching the silicon film 84 through the patterned photoresist 85 using, for example, but not limited to, a dry etching process followed a post wet clean process, or other suitable processes. After the etching process, the patterned photoresist 85 may then be removed.

Figure 31:
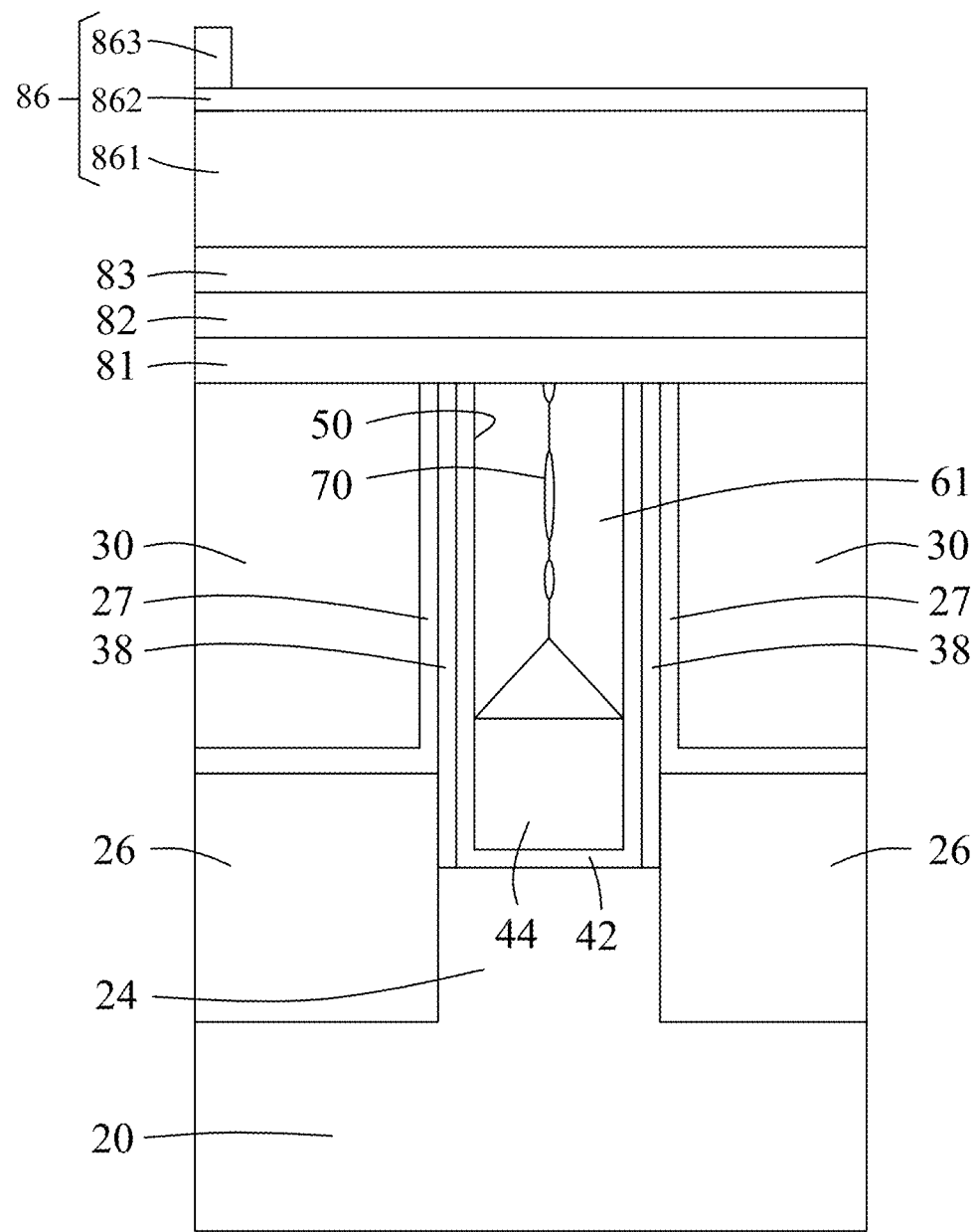
Figure 32:
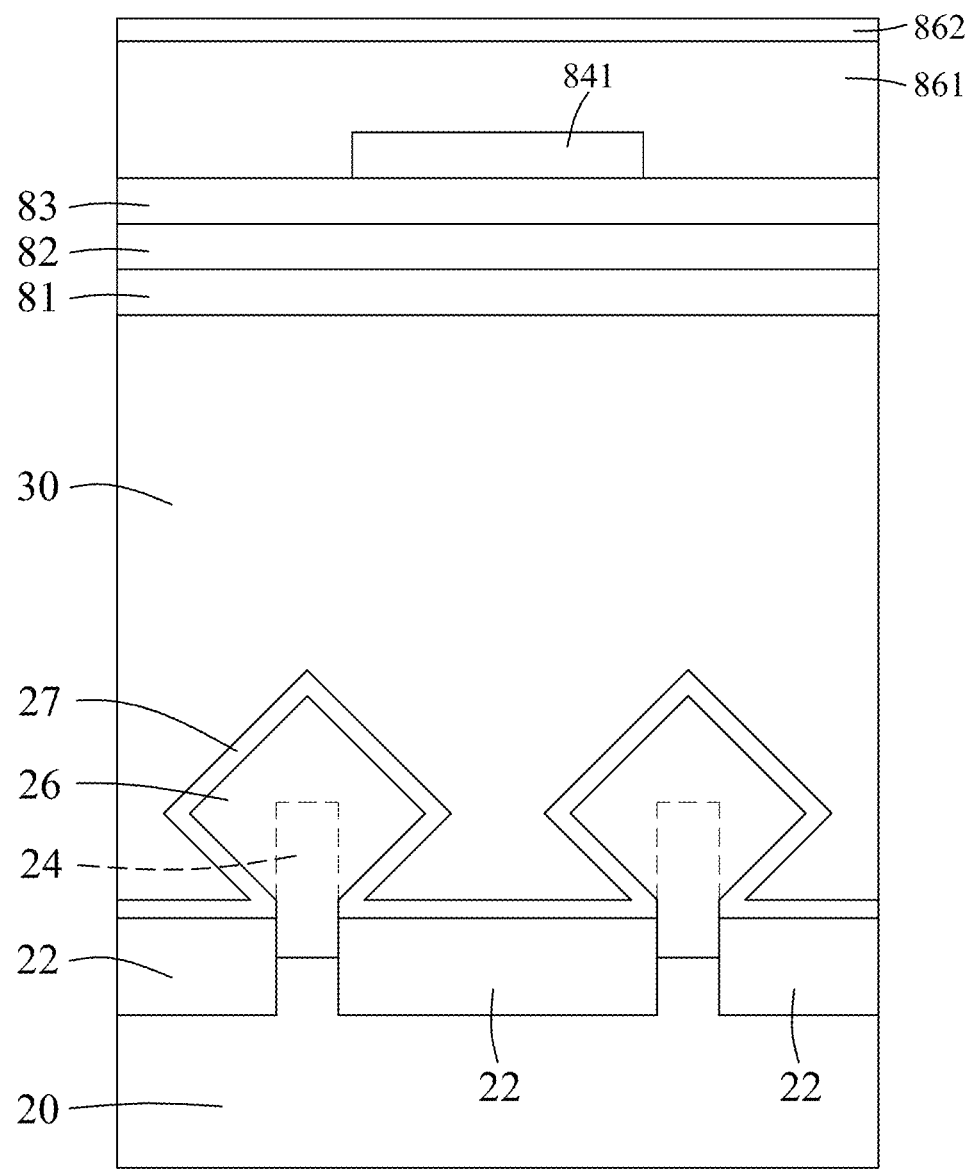
Figure 33:
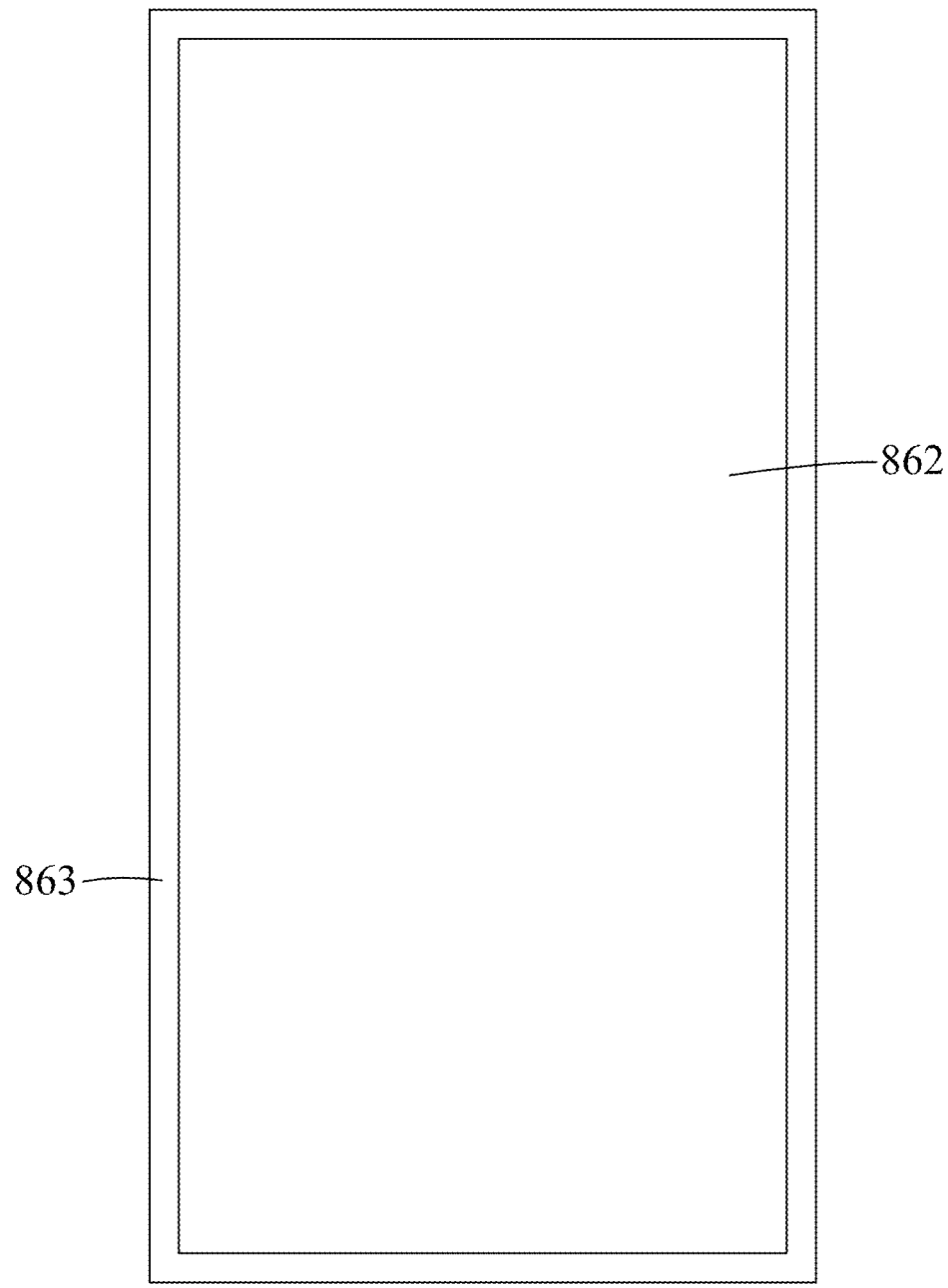

Referring to FIGS. 1B and 31-33, the method 100 proceeds to step 117, where a photoresist is applied and patterned to form a patterned photoresist 86 on the second oxide film 83. FIGS. 31-33 are viewed from the same perspectives as FIGS. 28-30, respectively. The patterned photoresist 86 has an area (see FIG. 33) defining a processing region on the structure shown in FIG. 30. Step 117 may be implemented using a photolithography process similar to that described in step 115. In some embodiments, the patterned photoresist 86 may include, from bottom to top, a bottom layer 861, a middle layer 862 and a top photoresist layer 863 which include materials similar to those of the bottom layer 851, the middle layer 852 and the top photoresist layer 853, respectively, of the pattern photoresist 85.

Figure 34:
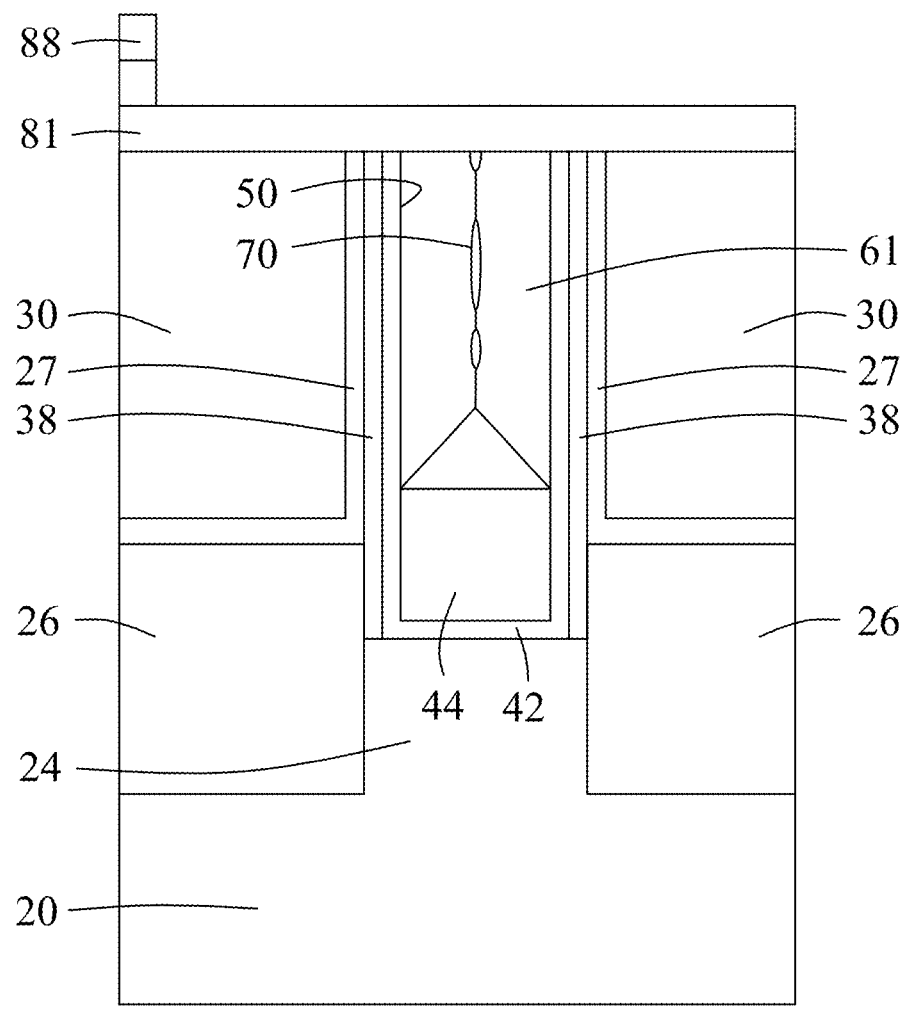
Figure 35:
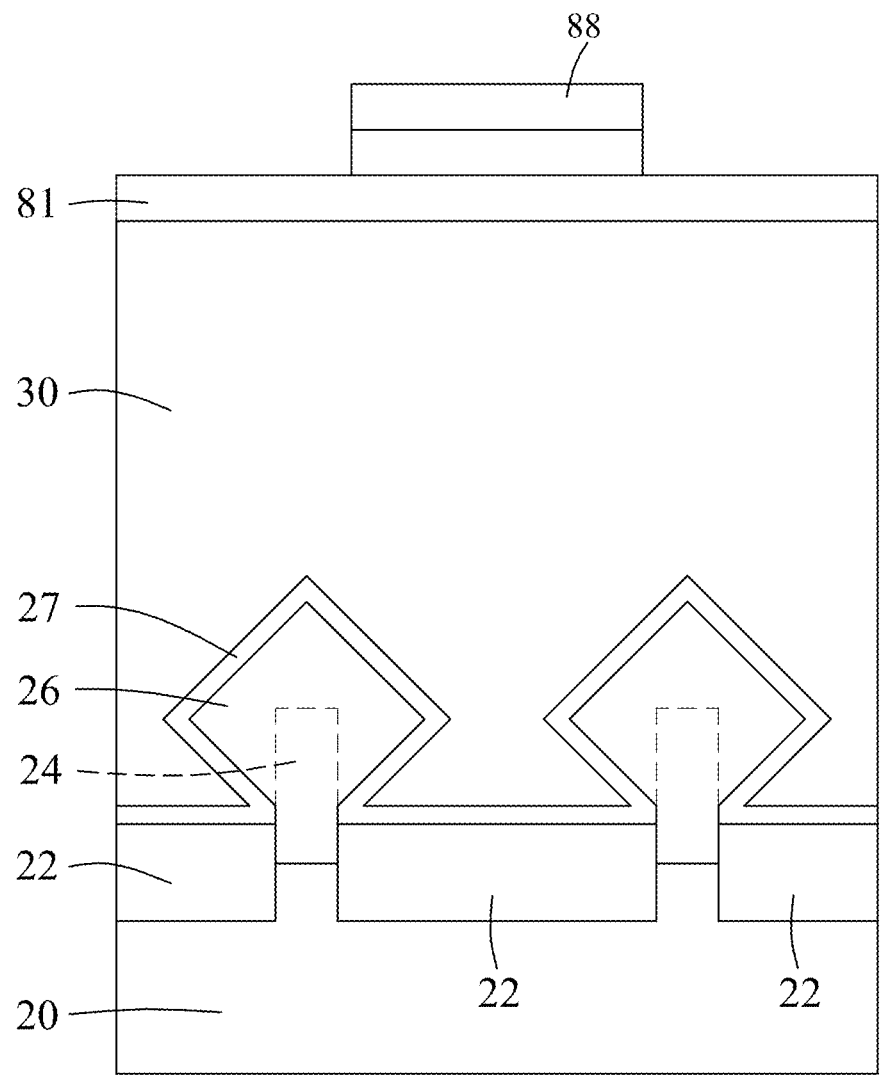
Figure 36:
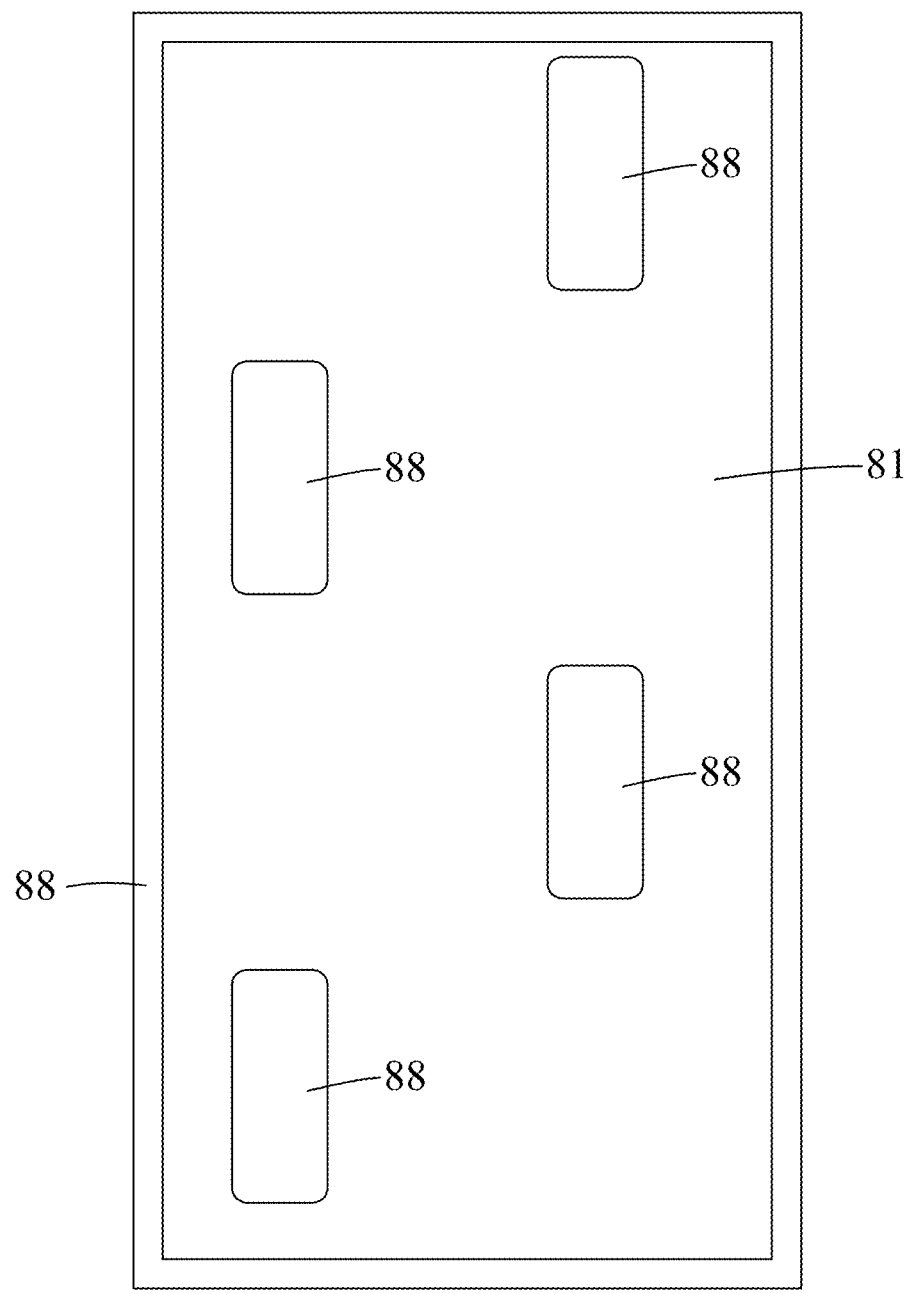

Referring to FIGS. 1B and 34-36, the method 100 proceeds to step 118, where an etching process is conducted to sequentially pattern the second oxide film 83 and the tungsten carbide film 82 using the patterned photoresist 86 formed in step 117 and the silicon caps 841 formed in step 116 as a mask so as to form metal-to-device (MD) hard masks 88 on the first oxide film 81. FIGS. 34-36 are viewed from the same perspectives as FIGS. 31-33, respectively. It is noted that the MD hard masks 88 (defined by the top photoresist layer 853 and the top photoresist layer 863) may include remaining portions of the second oxide film 83 and remaining portions of the tungsten carbine film 82. Step 118 may be implemented using an etching process similar to that described in step 116. After the etching process, the patterned photoresist 86 and the silicon cap 841 may then be removed.

Figure 37:
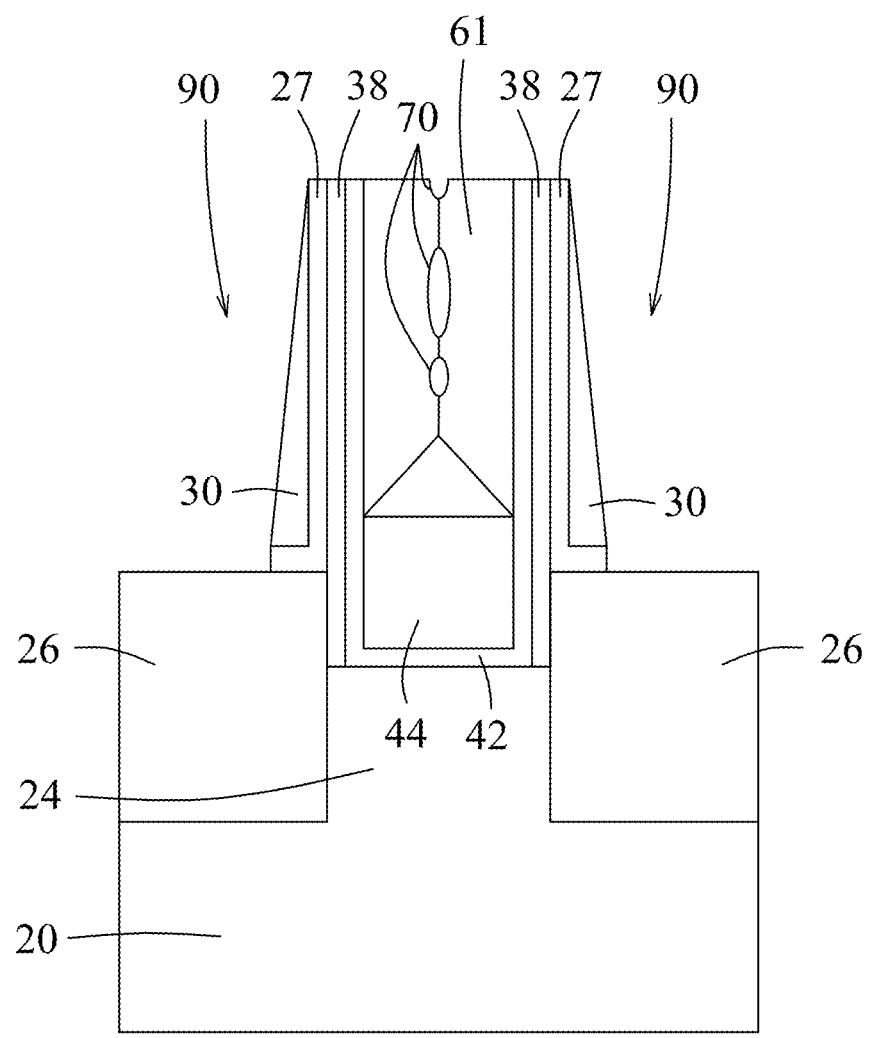
Figure 38:
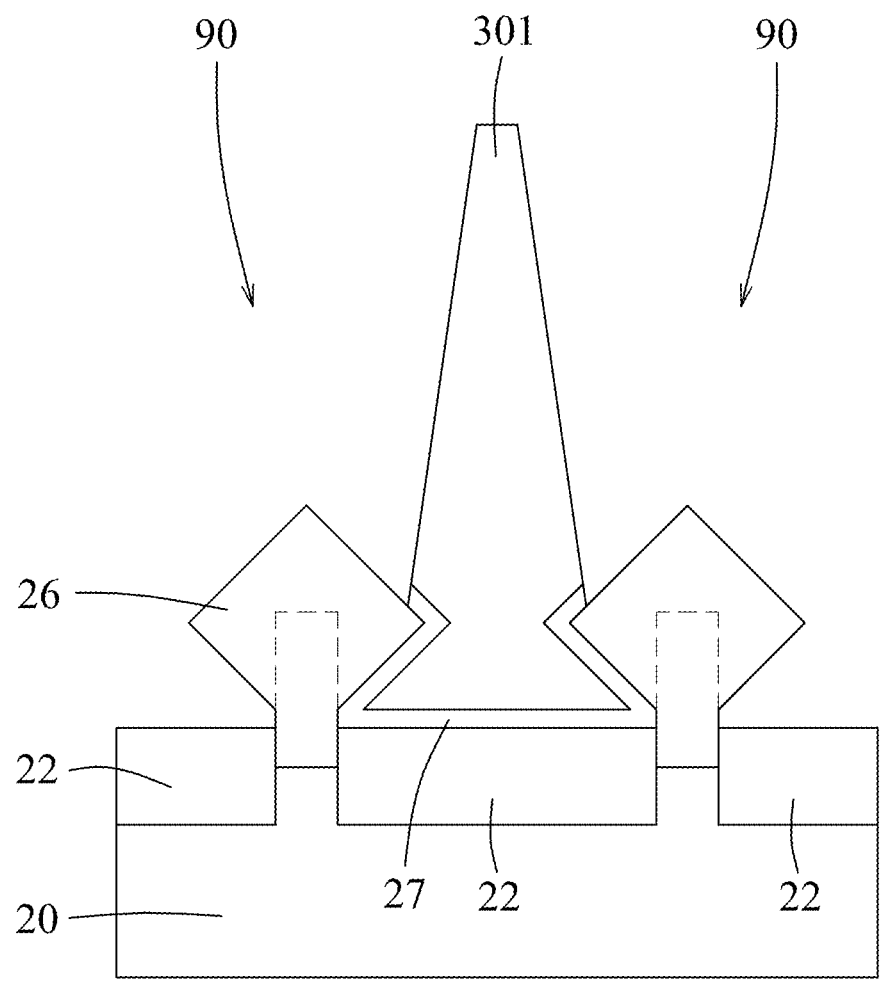
Figure 39:
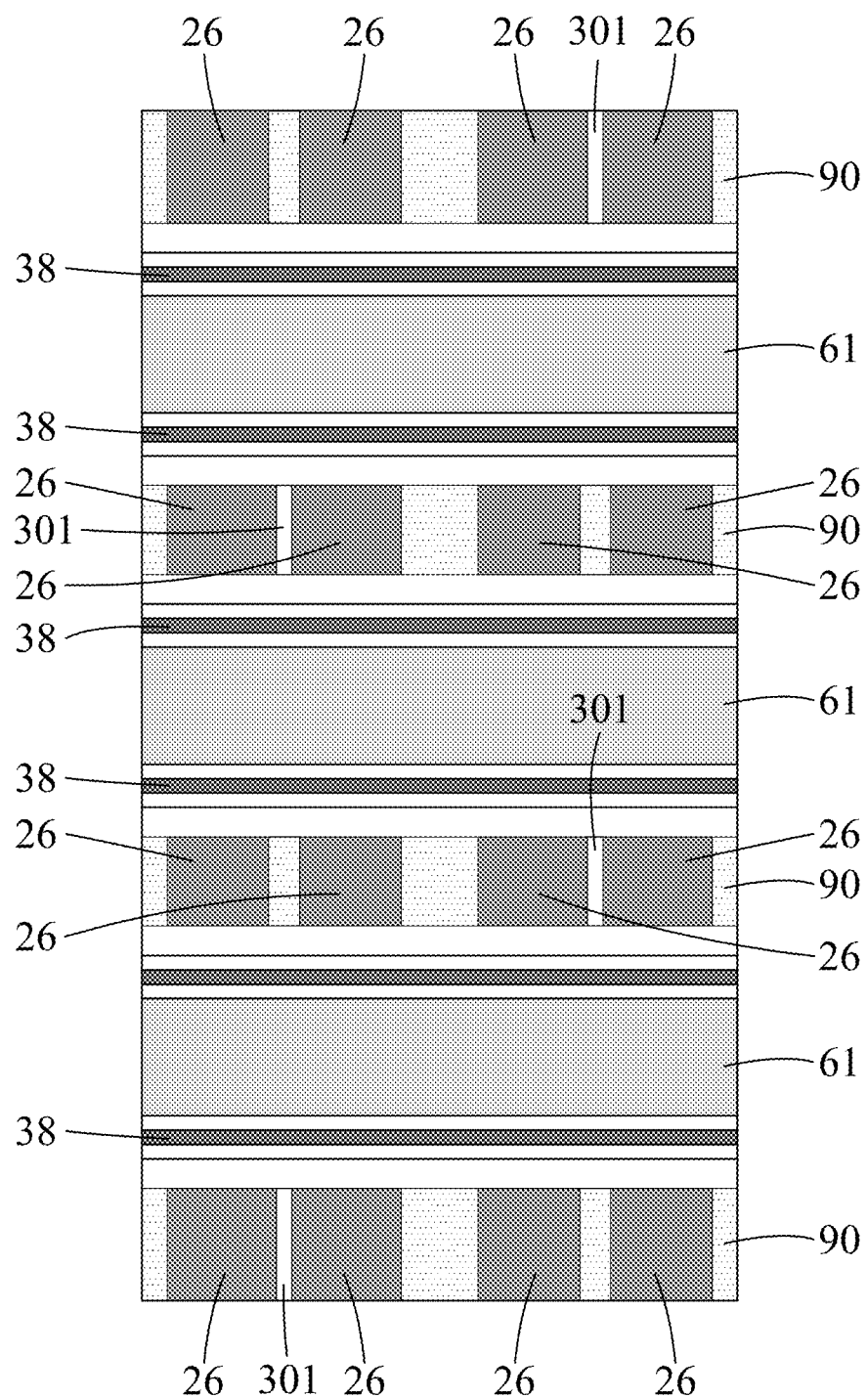
Figure 40:
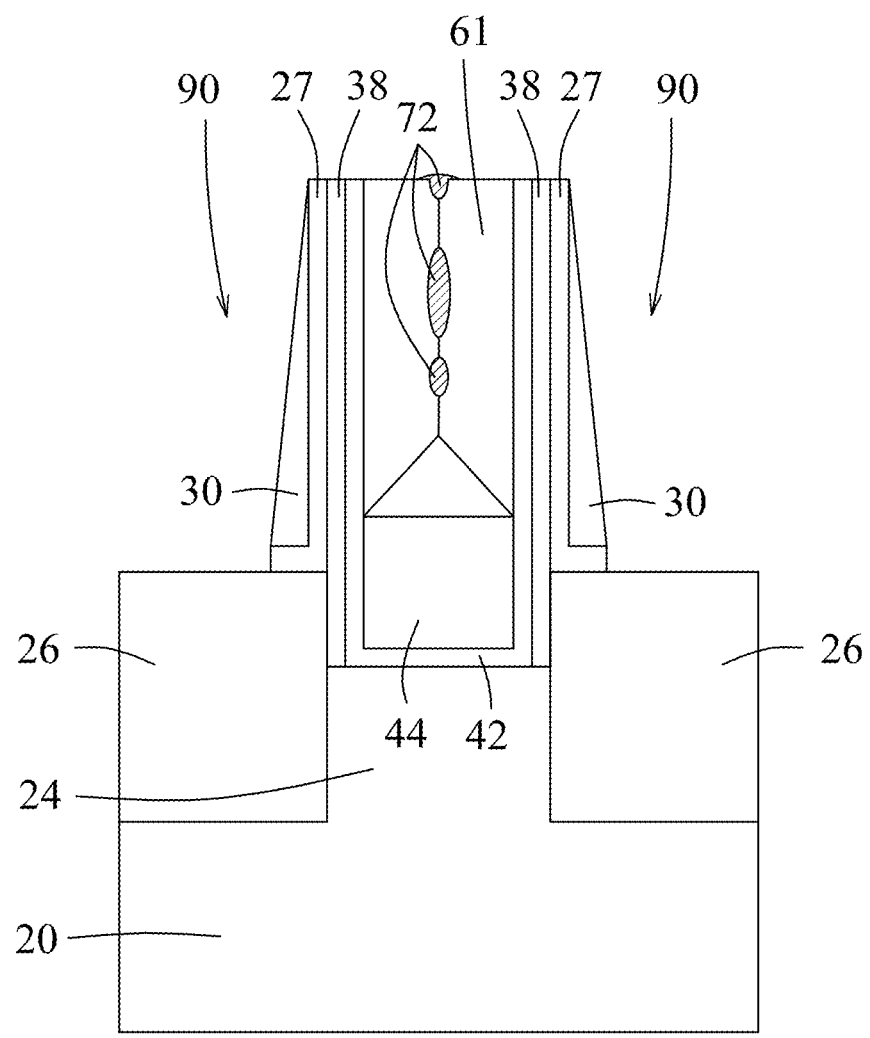
Figure 41:
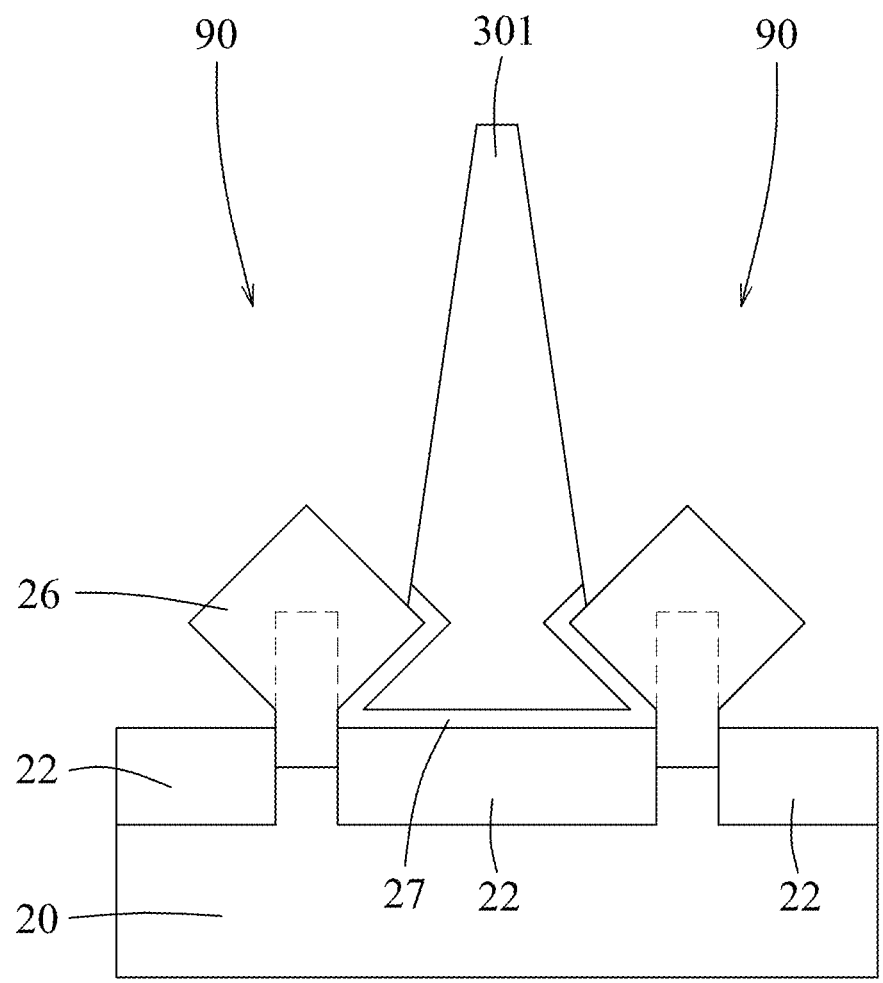
Figure 42:
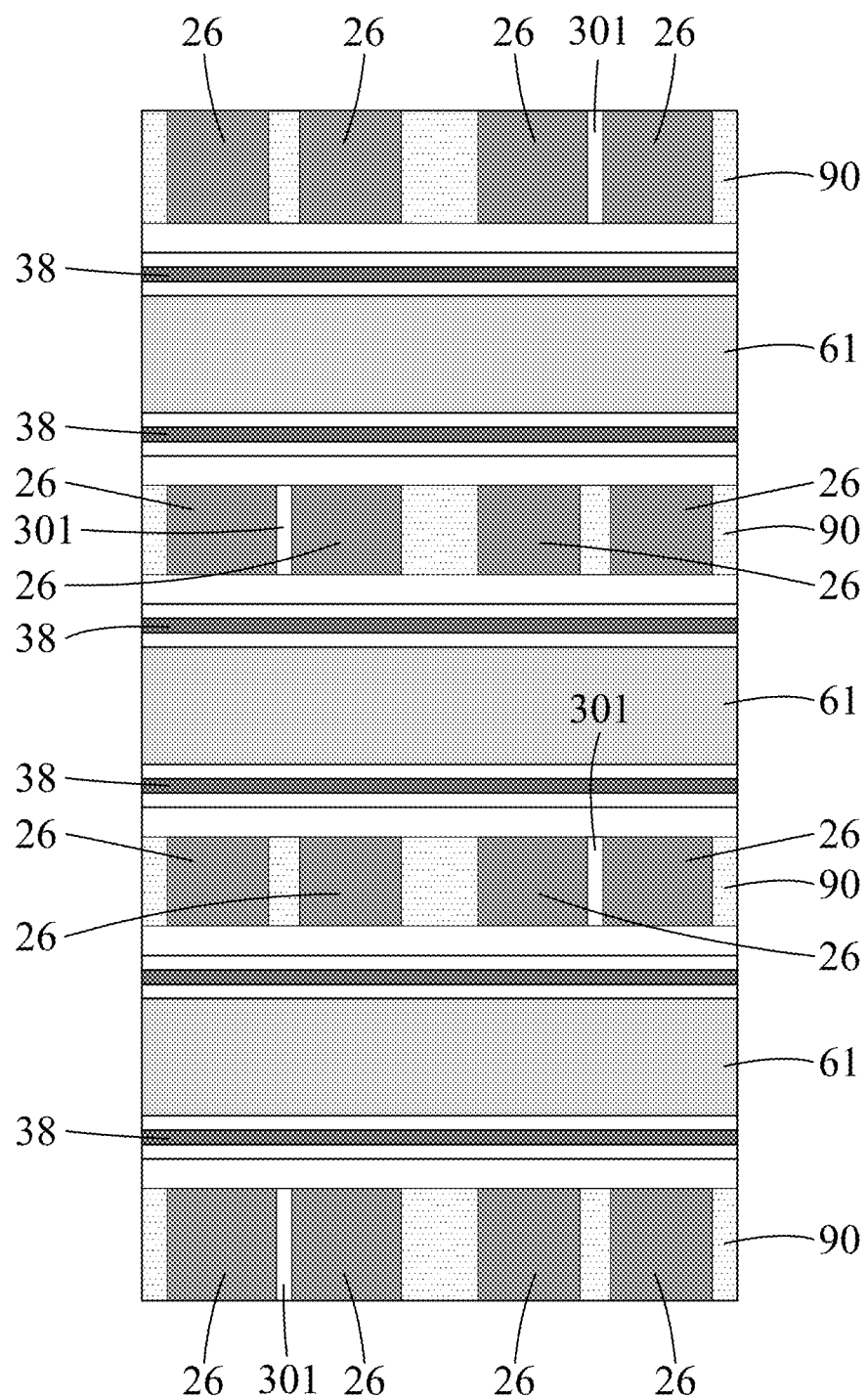
Figure 43:
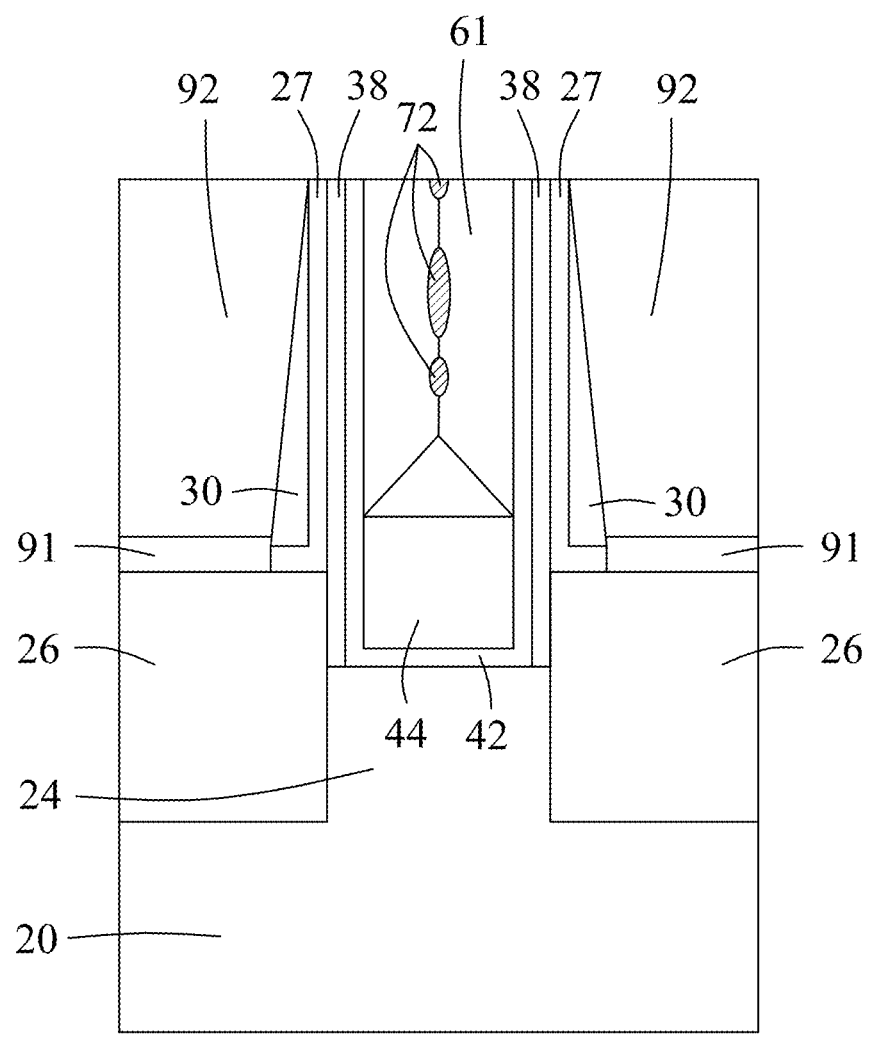
Figure 44:
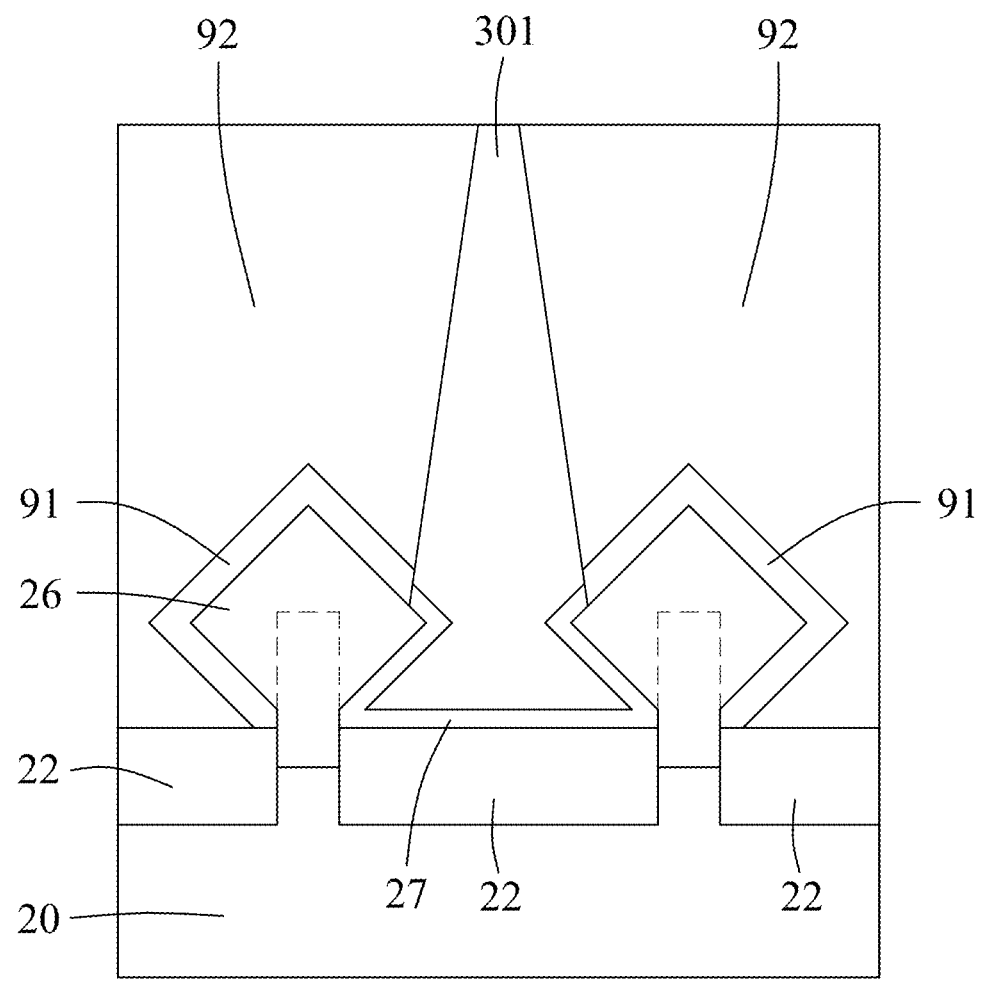
Figure 45:
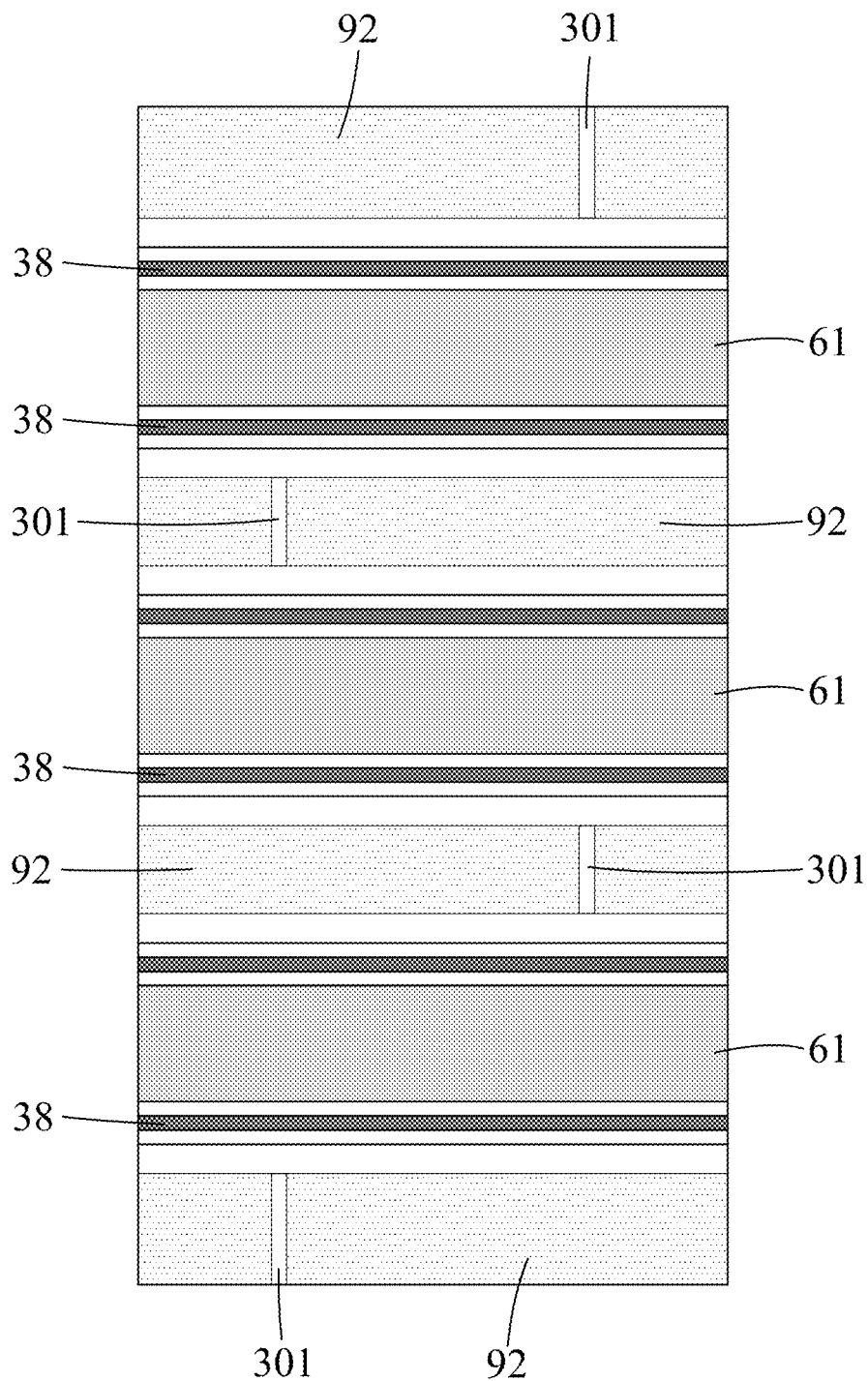

Referring to FIGS. 1B and 37-39, the method 100 proceeds to step 119, where an MD etching process is conducted to etch the first oxide layer 81, the ILD layer 30 and the CESL 27 using the MD hard masks 88 (defined by the top photoresist layer 853 and the top photoresist layer 863) as a mask to form MD recesses 90. FIGS. 37-39 are viewed from the same perspectives as FIGS. 34-36, respectively. The term "MD etching" stands for a process for forming recesses that are to be filled with metal contacts in the subsequent step. It is noted that since the ILD layer 30 have etch rates higher than those of the SAC layers 61 and the gate spacers 38 during the MD etching process, the MD recesses 90 may be created between the metal gates 40 on which the SAC layers 61 are disposed (see FIG. 39). Portions of the ILD layer 30 underneath the isle-shaped MD hard masks 88 (defined by the top photoresist layer 853) (see FIG. 36) are protected from being etched so as to form dielectric ridges 301 for separating the MD recesses 90 (only one dielectric ridge 301 is shown in FIG. 38). The MD recesses 90 are formed to expose the epitaxy regions 26. Step 119 may be implemented using a known process in the art, such as, but not limited to, a dry etching process (e.g., a plasma etching process), or other suitable processes. After step 119, the MD hard masks 88 may be removed.

In some embodiments, during the MD etching process, the seams 70 may be enlarged and may have dimensions increased from about 2 nanometers to about 3 nanometers.

Referring to FIGS. 1B and 40-42, the method 100 proceeds to step 120, where a sealing process is conducted to seal the seams 70 enlarged during the MD etching process of step 119. The seam sealing procedure may be implemented using a deposition process to form a filler 72 in the seams or in openings of the seams 70 so as to seal the seams 70. In some embodiments, the filler 72 may include a dielectric material, and the dielectric material has a deposition rate on surfaces of the SAC layers 61 higher than a deposition rate on a surface of the ILD layer 30. In some embodiments, the filler 72 may be formed on top surfaces of the SAC layers 61 to cover the openings of the seams 70. The dielectric material of the filler 72 may include, for example, but not limited to, a polymer, oxide, boron nitride (BNx), boron carbide (BCx), other suitable materials, or combinations thereof. In some embodiments, the dielectric material of the filler 72 has a deposition rate on the surfaces of the SAC layers 61 at least about 1.2 times higher than a deposition rate on the surface of the ILD layer 30. It is noted that the range (i.e., at least about 1.2 times higher) is selected so that the filler 72 is more likely to be formed in the seams 70 rather than on undesirable positions, such as sidewalls of the MD recesses 90.

In some embodiments, a fluorocarbon plasma containing a high carbon to fluorine (C/F) ratio is employed in the deposition process in order to form the filler 72. In these embodiments, the filler 72 includes a polymer, such as a fluorocarbon-based polymer (referred to as fluorocarbons (CxFy) hereinafter), because polymerization is prone to occur in plasma having a high C/F ratio. In this way, a polymer film that includes fluorocarbons may be formed as the filler 72 to seal the seams 70. In variations of some embodiments, hydrofluorocarbon (e.g., $CH_3F$, $CH_2F_2$, or $CHF_3$) and oxygen plasmas containing a high hydrofluorocarbon to oxygen ratio, for example, greater than about 20:1, are used to form the polymer film including fluorocarbons. In some embodiments, the hydrofluorocarbon plasma may be replaced by a hexafluoro-1,3-butadiene ($C_4F_6$) plasma or an octafluorocyclobutane ($C_4F_8$) plasma, and the oxygen plasma may be replaced by a CO plasma or a $CO_2$ plasma. In some embodiments, the deposition process involving polymerization is conducted under conditions that may involve, for example, but not limited to, (i) a process temperature that may be set lower than about 20° C., (ii) a process pressure that may be set higher than about 30 millitorr, and (iii) a bias voltage that may be set lower than about 100 volts. It is noted that the range (i.e., greater than about 20:1) is selected so that polymerization is more likely to occur to allow formation of the polymer film including fluorocarbons.

In some embodiments, silicon tetrachloride ($SiCl_4$) and oxygen plasmas are employed in the deposition process in order to form the filler 72 that includes oxide, such as silicon oxide (SiOx). The chemical equation for the deposition process may be denoted: $SiCl_4+O_2 \rightarrow SiO_2+2Cl_2$. In this way, an oxide film which includes silicon dioxide may be formed as the filler 72 to seal the seams 70. In some embodiments, the deposition process for forming silicon dioxide is conducted under conditions that may involve, for example, but not limited to, (i) a gas flow ratio of $SiCl_4$ to $O_2$ that may be set in a range from about 0.01 to 1, (ii) a process temperature that may be set in a range from about 0° C. to about 80° C., (iii) a process pressure that may be set in a range from about 3 millitorr to about 500 millitorr, (iv)

a process power that may be set in a range from about 30 watt to about 1000 watt, and (v) a process time that may be set in a range from about 3 seconds to 30 seconds.

In some embodiments, boron trichloride ($BCl_3$) and dinitrogen plasmas are employed in the deposition process in order to form the filler 72 that includes boron nitride (BNx). In this way, a boron nitride film may be formed as the filler 72 to seal the seams 70. In some embodiments, the deposition process for forming boron nitride is conducted under conditions that may involve, for example, but not limited to, (i) a gas flow ratio of boron trichloride to dinitrogen that may be set in a range from about 0.1 to 10, (ii) a process temperature that may be set in a range from about 0° C. to about 150° C., (iii) a process pressure that may be set in a range from about 3 millitorr to about 500 millitorr, (iv) a process power that may be set in a range from about 50 watt to about 1000 watt, and (v) a process time that may be set in a range from about 3 seconds to 30 seconds. In variations of some embodiments, boron trichloride and ammonia ($NH_3$) plasmas are employed in the deposition process in order to form the filler 72 that includes boron nitride.

In some embodiments, boron trichloride ($BCl_3$), methane ($CH_4$) and hydrogen plasmas are employed in the deposition process in order to form the filler 72 that includes boron carbide (BCx). In this way, a boron carbide film may be formed as the filler 72 to seal the seams 70. In some embodiments, the deposition process for forming boron carbide is conducted under conditions that may involve, for example, but not limited to, (i) a process temperature that may be set in a range from about 0° C. to about 150° C., (ii) a process pressure that may be set in a range from about 3 millitorr to about 500 millitorr, (iii) a process power that may be set in a range from about 50 watt to about 1000 watt, and (iv) a process time that may be set in a range from about 3 seconds to 30 seconds.

In alternative embodiments of the present disclosure, the sealing process in step 120 is conducted along with the MD etching process in step 119, instead of being conducted individually. In other words, the filler 72 is formed using polymerization to seal the seams 70 while the MD recesses 90 are formed by etching the first oxide layer 81, the ILD layer 30 and the CESL 27.

In this case, the etching process may be a plasma etching process using fluorocarbon (CxFy) and oxygen plasmas. The plasmas may be generated by a plasma generation device, such as, but not limited to, a capacitive coupling plasma generator (CCP), a transformer-coupled plasma (TCP), an inductively coupled plasma system (ICP), a magnetically enhanced reactive ion etching system, an electron cyclotron resonance system, a remote plasma generator, other suitable devices or systems, or combinations thereof. Gas sources for generating the plasmas may include etching gases and may optionally further include a carrier gas (for dilution of the etching gases). In certain embodiments, the etching gas is a combination of a fluorocarbon compound and oxygen gas. The fluorocarbon compound may include, for example, but not limited to, hexafluoro-1,3-butadiene ($C_4F_6$), octafluorocyclobutane ($C_4F_8$), other suitable fluorocarbon compounds, or combinations thereof. In certain embodiments, the fluorocarbon plasma may be replaced by hydrofluorocarbon plasma, and the oxygen plasma may be replaced by CO plasma or $CO_2$ plasma. The carrier gas may include, for example, but not limited to, a helium gas, an argon gas, other suitable gases, or combinations thereof. In order to etch the first oxide layer 81, the ILD layer 30 and the CESL 27 to form the MD recesses 90, (i) a flow rate of the etching gases may be set in a range from about 0.5 sccm to about 200 sccm, (ii) a flow rate of the carrier gas may be set in a range from about 20 sccm to about 1000 sccm, (iii) a process temperature may be set in a range from about −50° C. to about 150° C., and (iv) a process pressure may be set in a range from about 1 millitorr to about 80 millitorr. In alternative embodiments, a slightly higher or lower flow rate for each of the etching gases and the carrier gas, a slightly higher or lower process temperature, or a slightly higher or lower process pressure may be used, depending on the device's expected performance or the designs of the semiconductor structure that is to be produced.

In the plasma etching process, polymerization is a competing process that can be dominant over etching depending on the C/F ratio. As the C/F ratio is increased, polymerization is favored over etching. Therefore, by increasing the C/F ratio of the etching gases provided initially for the plasma etching process, the filler 72 that includes a polymer, such as fluorocarbons (CxFy), may be formed through polymerization on the SAC layers 61 to seal the seams 70. The C/F ration may be modified by various processes or gas additions. For example, a primary etchant species for silicon (i.e., F atoms) may be consumed by reaction with hydrogen to form HF, so that the C/F ratio increases, thereby enhancing polymerization. Alternatively, the C/F ratio may be increased by decreasing the amount of oxygen, so that the number of C atoms consumed by reaction with oxygen is decreased. As a result, the C/F ratio may be increased, thereby enhancing polymerization. In some embodiments, the C/F ratio may be increased to be greater than about 1:2 and/or the process temperature may be set lower than about 20° C. to allow occurrence of polymerization for forming the filler 72 to seal the seams 70. It is noted that the range (i.e., greater than about 1:2) is selected so that polymerization is more likely to occur to allow formation of the filler 72 that includes fluorocarbons. In some embodiments, the etching process and the deposition process (e.g., polymerization) may occur simultaneously. That is to say, the ILD layer 30 is being etched while the filler 72 is being formed on the surfaces of the SAC layers 61.

Referring to FIGS. 1B and 43-45, the method 100 proceeds to step 121, where silicide layers 91 are respectively formed on the epitaxy regions 26 exposed from the MD recesses 90, a metal material is then applied to fill the MD recesses 90, and a planarization process is ultimately performed to remove excesses of the metal material layer so as to form metal contacts 92 in the MD recesses 90, respectively.

In some embodiments, the silicide layers 91 may include silicon and at least one metal element including, for example, but not limited to, aluminum, titanium, nickel, cobalt, other suitable materials, or combinations thereof. The silicide layers 91 may be formed by first forming a metal layer that contains the metal element on the epitaxy regions 26 (source/drain regions) followed by an anneal process. In some embodiments, the metal layer may be applied using PVD, sputtering, low pressure CVD (LPCVD), atomic layer chemical vapor deposition (ALD), electroless plating, other suitable methods, or combinations thereof. The annealing may be performed using thermal annealing, flash annealing, laser annealing, and the like. The metal material for the metal contacts 92 may include a conductive material such as, but not limited to, cobalt, copper, ruthenium, tungsten, other suitable materials, or combinations thereof. In some embodiments, the planarization may be implemented using, for example, but not limited to, chemical mechanical polishing (CMP), other suitable methods, or combinations thereof.

In subsequent processes (e.g., via-to-contact formation processes), each of the epitaxy regions 26 (source/drain regions) may be electrically connected to an outer metal wiring (not shown) through a respective one of the metal contacts 92. The metal contact 92 may be referred to as "metal-to-device (MD) contacts" for serving as contacts to an OD region of the semiconductor structure, for example, the epitaxy regions 26.

In alternative embodiments, additional features may be added in the semiconductor structure obtained in step 121, and some features in the semiconductor structure obtained in step 121 may be modified, replaced, or eliminated based on the design of the product that is to be produced.

In this disclosure, the filler 72 is formed in the seams 70 or in the openings of the seams 70 to seal the seams 70, so metal or slurry may not fill in the seams 70 in subsequent processes of forming metal contacts 92 and chemical mechanical polishing. In addition, since the filler 72 is a dielectric material, electrical insulation of the SAC layers 61 may be maintained. Moreover, the dielectric material of the filler 72 is selected to have a deposition rate on surfaces of the SAC layers 61 at least about 1.2 times higher than that on a surface of the ILD layer 30, so that the filler 72 is more likely to be formed in the seams 70 rather than on undesirable positions, such as sidewalls of the MD recesses 90. As a result, a yield of the semiconductor structure may be promoted.

In accordance with some embodiments of the present disclosure, a method for sealing a seam in a self-aligned contact (SAC) layer that is disposed on a gate of a semiconductor structure includes depositing a filler in the seam to seal the seam.

In accordance with some embodiments of the present disclosure, the filler includes a dielectric material.

In accordance with some embodiments of the present disclosure, the semiconductor structure includes an interlayer dielectric (ILD) layer disposed adjacent to the gate and the SAC layer, the dielectric material of the filler having a deposition rate on a surface of the SAC layer higher than that on a surface of the ILD layer.

In accordance with some embodiments of the present disclosure, the dielectric material of the filler has the deposition rate on the surface of the SAC layer at least 1.2 times higher than that on the surface of the ILD layer.

In accordance with some embodiments of the present disclosure, the dielectric material of the filler includes a polymer, oxide, boron nitride, boron carbide, or combinations thereof.

In accordance with some embodiments of the present disclosure, the dielectric material of the filler includes a fluorocarbon-based polymer, and depositing the filler is conducted using a fluorocarbon plasma.

In accordance with some embodiments of the present disclosure, the dielectric material of the filler includes a fluorocarbon-based polymer, and depositing the filler is conducted using a hydrofluorocarbon (e.g., $CH_3F$, $CH_2F_2$ or $CHF_3$) or fluorocarbon (e.g., $C_4F_6$ or $C_4F_8$) plasma and an $O_2$, CO or $CO_2$ plasma.

In accordance with some embodiments of the present disclosure, the dielectric material of the filler includes silicon oxide, and depositing the filler is conducted using a silicon tetrachloride plasma and an oxygen plasma.

In accordance with some embodiments of the present disclosure, the dielectric material of the filler includes boron nitride, and depositing the filler is conducted using a boron trichloride plasma and a dinitrogen plasma.

In accordance with some embodiments of the present disclosure, the dielectric material of the filler includes boron nitride, and depositing the filler is conducted using a boron trichloride plasma and an ammonia plasma.

In accordance with some embodiments of the present disclosure, the dielectric material of the filler includes boron carbide, and depositing the filler is conducted using a boron trichloride plasma, a methane plasma and a hydrogen plasma.

In accordance with some embodiments of the present disclosure, a method for manufacturing a semiconductor structure includes forming a metal gate over a substrate unit that includes source/drain regions and an interlayer dielectric (ILD) layer above the source/drain regions, where the metal gate is formed in a recess of the ILD layer; forming a self-aligned contact (SAC) layer on the metal gate, the SAC layer having a seam or void formed therein; etching the ILD layer to form contact recesses for exposing the source/drain regions; depositing a filler on a surface of the SAC layer to seal the seam or void in the SAC layer; and forming metal contacts on the source/drain regions and in the contact recesses.

In accordance with some embodiments of the present disclosure, the filler includes a dielectric material that has a deposition rate on the surface of the SAC layer higher than that on a surface of the ILD layer.

In accordance with some embodiments of the present disclosure, the dielectric material of the filler has the deposition rate on the surface of the SAC layer at least 1.2 times higher than that on the surface of the ILD layer.

In accordance with some embodiments of the present disclosure, the step of etching the ILD layer includes performing a plasma etching process using a fluorocarbon plasma and an oxygen plasma.

In accordance with some embodiments of the present disclosure, the step of depositing the filler is conducted by increasing a carbon to fluorine ratio of the fluorocarbon plasma, so that the filler is formed through polymerization on the surface of the SAC layer to seal the seam.

In accordance with some embodiments of the present disclosure, the step of depositing the filler is conducted along with the step of etching the ILD layer (by fine tuning the C/F ratio of the fluorocarbon plasma to allow occurrence of deposition), or after the step of etching the ILD layer.

In accordance with some embodiments of the present disclosure, the filler includes a fluorocarbon-based polymer.

In accordance with some embodiments of the present disclosure, the carbon to fluorine ratio of the fluorocarbon plasma is increased to be greater than 1:2 to enable occurrence of polymerization.

In accordance with some embodiments of the present disclosure, a semiconductor structure includes a substrate unit, metal contacts, a metal gate, a self-aligned contact (SAC) layer and a dielectric filler. The substrate unit includes source/drain regions. The metal contacts are formed on the source/drain regions, respectively. The metal gate is formed on the substrate unit and disposed between the metal contacts. The SAC layer is disposed on and covers the metal gate, and the SAC layer is formed with a seam or void. The dielectric filler is formed in the seam to seal the seam.

In accordance with some embodiments of the present disclosure, the SAC layer includes silicon nitride, silicon carbon nitride, silicon oxycarbide, silicon oxycarbonitride, or combinations thereof. The dielectric filler includes a fluorocarbon-based polymer, oxide, boron nitride, boron carbide, or combinations thereof.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for sealing a seam in a self-aligned contact (SAC) layer that is disposed on a gate of a semiconductor structure, the semiconductor structure including an interlayer dielectric (ILD) layer disposed adjacent to the gate and the SAC layer, the seam being exposed at a top surface of the SAC layer, the method comprising:
   etching the ILD layer to form contact recesses; and
   depositing a filler in the seam exposed at the top surface of the SAC layer to seal the seam,
   wherein etching the ILD layer and depositing the filler are conducted using a hydrofluorocarbon or fluorocarbon plasma and an oxygen plasma, and when depositing the filler, a carbon to fluorine ratio of the hydrofluorocarbon or fluorocarbon plasma is increased by decreasing the amount of oxygen, so that the filler is formed through polymerization on the surface of the SAC layer to seal the seam.

2. The method of claim 1, wherein the filler includes a dielectric material.

3. The method of claim 2, wherein the dielectric material of the filler has a deposition rate on a surface of the SAC layer higher than that on a surface of the ILD layer.

4. The method of claim 3, wherein the dielectric material of the filler has the deposition rate on the surface of the SAC layer at least 1.2 times higher than that on the surface of the ILD layer.

5. The method of claim 2, wherein the dielectric material of the filler includes a polymer.

6. The method of claim 5, wherein the dielectric material of the filler includes a fluorocarbon-based polymer.

7. A method for manufacturing a semiconductor structure, comprising:
   forming a metal gate over a substrate unit that includes source/drain regions and an interlayer dielectric (ILD) layer above the source/drain regions, where the metal gate is formed in a recess of the ILD layer;
   forming a self-aligned contact (SAC) layer on the metal gate, the SAC layer having a seam formed therein, the seam being exposed at a top surface of the SAC layer;
   etching the ILD layer to form contact recesses for exposing the source/drain regions;
   depositing a filler on the top surface of the SAC layer to seal the seam exposed at the top surface of the SAC layer, wherein etching the ILD layer and depositing the filler are conducted using a fluorocarbon plasma and an oxygen plasma, and when depositing the filler, a carbon to fluorine ratio of the fluorocarbon plasma is increased by decreasing the amount of oxygen, so that the filler is formed through polymerization on the top surface of the SAC layer to seal the seam; and
   forming metal contacts on the source/drain regions and in the contact recesses, the metal contacts having top surfaces flush with a top surface of the filler.

8. The method of claim 7, wherein the filler includes a dielectric material that has a deposition rate on the surface of the SAC layer higher than that on a surface of the ILD layer.

9. The method of claim 8, wherein the dielectric material of the filler has the deposition rate on the surface of the SAC layer at least 1.2 times higher than that on the surface of the ILD layer.

10. The method of claim 7, wherein the filler includes a fluorocarbon-based polymer.

11. The method of claim 7, wherein the carbon to fluorine ratio of the fluorocarbon plasma is increased to be greater than 1:2 to enable occurrence of polymerization.

12. A method for manufacturing a semiconductor structure, comprising:
   forming a self-aligned contact (SAC) layer over a substrate unit that includes a metal gate, epitaxy regions on opposite sides of the metal gate, and an interlayer dielectric (ILD) layer above the epitaxy regions, where the SAC layer is formed in a gate recess of the metal gate, and has a seam formed therein, the seam being exposed at a top surface of the SAC layer;
   performing an etching and polymerization process to etch the ILD layer for exposing the epitaxy regions and to deposit a filler on the top surface of the SAC layer to seal the seam exposed at the top surface of the SAC layer, wherein the etching and polymerization process is conducted using a fluorocarbon plasma and an oxygen plasma, and when depositing the filler, a carbon to fluorine ratio of the fluorocarbon plasma is increased by decreasing the amount of oxygen, so that the filler is formed through polymerization on the top surface of the SAC layer to seal the seam; and
   forming metal contacts on the epitaxy regions, the metal contacts having top surfaces flush with a top surface of the filler.

13. The method of claim 12, wherein etching of the ILD layer and deposition of the filler under the etching and polymerization process occur simultaneously.

14. The method of claim 1, wherein in the step of depositing the filler, the amount of oxygen is decreased so that a ratio of the hydrofluorocarbon or fluorocarbon plasma to the oxygen plasma is greater than 20:1.

15. The method of claim 1, wherein gas sources for generating the hydrofluorocarbon or fluorocarbon plasma and the oxygen plasma include etching gases and a carrier gas for dilution of the etching gases.

16. The method of claim 15, wherein the carrier gas includes one of a helium gas and an argon gas.

17. The method of claim 7, wherein in the step of depositing the filler, the amount of oxygen is decreased so that a ratio of the fluorocarbon plasma to the oxygen plasma is greater than 20:1.

18. The method of claim 7, wherein gas sources for generating the fluorocarbon plasma and the oxygen plasma include etching gases and a carrier gas for dilution of the etching gases.

19. The method of claim 18, wherein the carrier gas includes one of a helium gas and an argon gas.

20. The method of claim 12, wherein when depositing the filler, the amount of oxygen is decreased so that a ratio of the fluorocarbon plasma to the oxygen plasma is greater than 20:1.

* * * * *